United States Patent
Haddad et al.

(10) Patent No.: US 10,269,861 B2
(45) Date of Patent: Apr. 23, 2019

(54) PROCESS MODULE FOR INCREASING THE RESPONSE OF BACKSIDE ILLUMINATED PHOTOSENSITIVE IMAGERS AND ASSOCIATED METHODS

(71) Applicant: SiOnyx, LLC, Beverly, MA (US)

(72) Inventors: Homayoon Haddad, Beaverton, OR (US); Jeffrey McKee, Tualatin, OR (US); Jutao Jiang, Tigard, OR (US); Drake Miller, Tigard, OR (US); Chintamani Palsule, Lake Oswego, OR (US); Leonard Forbes, Corvallis, OR (US)

(73) Assignee: SiOnyx, LLC, Beverly, MA (US)

( * ) Notice: Subject to any disclaimer, the term of this patent is extended or adjusted under 35 U.S.C. 154(b) by 0 days.

(21) Appl. No.: 15/607,706

(22) Filed: May 30, 2017

(65) Prior Publication Data
US 2017/0263671 A1   Sep. 14, 2017

Related U.S. Application Data

(63) Continuation of application No. 15/287,430, filed on Oct. 6, 2016, now Pat. No. 9,666,636, which is a
(Continued)

(51) Int. Cl.
*H01L 31/00* (2006.01)
*H01L 27/146* (2006.01)
(Continued)

(52) U.S. Cl.
CPC .... *H01L 27/14685* (2013.01); *H01L 27/1462* (2013.01); *H01L 27/1464* (2013.01);
(Continued)

(58) Field of Classification Search
CPC ..... H01L 27/14; H01L 27/62; H01L 27/1464; H01L 31/0232; H01L 31/18
See application file for complete search history.

(56) References Cited

U.S. PATENT DOCUMENTS

| 3,487,223 A | 12/1969 | St. John |
| 3,922,571 A | 11/1975 | Smith |

(Continued)

FOREIGN PATENT DOCUMENTS

| AU | 3666484 | 6/1985 |
| CN | 1507075 | 6/2004 |

(Continued)

OTHER PUBLICATIONS

A. Arndt, J.F. Allison, J.G. Haynos, and A. Meulenberg, Jr., "Optical Properties of the COMSAT Non-reflective Cell," 11th IEEE Photovoltaic Spec. Conf., p. 40, 1975.

(Continued)

*Primary Examiner* — Mounir S Amer
*Assistant Examiner* — Alexander Belousov
(74) *Attorney, Agent, or Firm* — Thomas J. Engellenner; Reza Mollaaghababa; Pepper Hamilton LLP

(57) ABSTRACT

Backside illuminated photosensitive devices and associated methods are provided. In one aspect, for example, a backside-illuminated photosensitive imager device can include a semiconductor substrate having multiple doped regions forming a least one junction, a textured region coupled to the semiconductor substrate and positioned to interact with electromagnetic radiation where the textured region includes surface features sized and positioned to facilitate tuning to a preselected wavelength of light, and a dielectric region positioned between the textured region and the at least one junction. The dielectric region is positioned to isolate the at least one junction from the textured region, and the semi-
(Continued)

conductor substrate and the textured region are positioned such that incoming electromagnetic radiation passes through the semiconductor substrate before contacting the textured region. Additionally, the device includes an electrical transfer element coupled to the semiconductor substrate to transfer an electrical signal from the at least one junction.

10 Claims, 10 Drawing Sheets

Related U.S. Application Data continuation of application No. 13/493,891, filed on Jun. 11, 2012, now Pat. No. 9,496,308.

(60) Provisional application No. 61/495,243, filed on Jun. 9, 2011.

(51) Int. Cl.
  *H01L 31/0232* (2014.01)
  *H01L 31/18* (2006.01)
(52) U.S. Cl.
  CPC .. *H01L 27/14629* (2013.01); *H01L 27/14689* (2013.01); *H01L 27/14692* (2013.01); *H01L 31/0232* (2013.01); *H01L 31/18* (2013.01)

(56) References Cited

U.S. PATENT DOCUMENTS

| | | |
|---|---|---|
| 3,973,994 A | 8/1976 | Redfield |
| 3,994,012 A | 11/1976 | Warner, Jr. |
| 4,017,887 A | 4/1977 | Davies et al. |
| 4,105,955 A | 8/1978 | Hayashi |
| 4,149,174 A | 4/1979 | Shannon |
| 4,176,365 A | 11/1979 | Kroger |
| 4,181,538 A | 1/1980 | Narayan et al. |
| 4,201,450 A | 5/1980 | Trapani |
| 4,242,149 A | 12/1980 | King et al. |
| 4,253,882 A | 3/1981 | Dalal |
| 4,277,793 A | 7/1981 | Webb |
| 4,322,571 A | 3/1982 | Stanbery |
| 4,343,832 A | 8/1982 | Smith |
| 4,346,164 A | 8/1982 | Tabarelli et al. |
| 4,419,533 A | 12/1983 | Czubatyj et al. |
| 4,452,826 A | 6/1984 | Shields et al. |
| 4,493,942 A | 1/1985 | Sheng et al. |
| 4,514,582 A | 4/1985 | Tiedje et al. |
| 4,536,608 A | 8/1985 | Sheng et al. |
| 4,546,945 A | 10/1985 | Nessfield |
| 4,568,960 A | 2/1986 | Petroff et al. |
| 4,593,303 A | 6/1986 | Dyck et al. |
| 4,593,313 A | 6/1986 | Nagasaki |
| 4,617,593 A | 10/1986 | Dudley |
| 4,630,082 A | 12/1986 | Sakai |
| 4,648,936 A | 3/1987 | Ashby et al. |
| 4,663,188 A | 5/1987 | Kane |
| 4,672,206 A | 6/1987 | Suzuki |
| 4,673,770 A | 6/1987 | Mandelkorn |
| 4,679,068 A | 7/1987 | Lillquist et al. |
| 4,703,996 A | 11/1987 | Glass et al. |
| 4,723,086 A | 2/1988 | Leibovich et al. |
| 4,751,571 A | 6/1988 | Lillquist |
| 4,773,944 A | 9/1988 | Nath et al. |
| 4,775,425 A | 10/1988 | Guha et al. |
| 4,777,490 A | 10/1988 | Sharma et al. |
| 4,829,013 A | 5/1989 | Yamazaki |
| 4,838,952 A | 6/1989 | Dill et al. |
| 4,883,962 A | 11/1989 | Elliott |
| 4,886,958 A | 12/1989 | Merryman |
| 4,887,255 A | 12/1989 | Handa et al. |
| 4,894,526 A | 1/1990 | Bethea et al. |
| 4,910,568 A | 3/1990 | Taki et al. |
| 4,910,588 A | 3/1990 | Kinoshita et al. |
| 4,964,134 A | 10/1990 | Westbrook et al. |
| 4,965,784 A | 10/1990 | Land et al. |
| 4,968,372 A | 11/1990 | Maass |
| 4,999,308 A | 3/1991 | Nishiura et al. |
| 5,021,100 A | 6/1991 | Ishihara et al. |
| 5,021,854 A | 6/1991 | Huth |
| 5,080,725 A | 1/1992 | Green et al. |
| 5,081,049 A | 1/1992 | Green et al. |
| 5,089,437 A | 2/1992 | Shima et al. |
| 5,100,478 A | 3/1992 | Kawabata |
| 5,101,260 A | 3/1992 | Nath |
| 5,114,876 A | 5/1992 | Weiner |
| 5,127,964 A | 7/1992 | Hamakawa et al. |
| 5,164,324 A | 11/1992 | Russell et al. |
| 5,182,231 A | 1/1993 | Hongo et al. |
| 5,208,822 A | 5/1993 | Haus et al. |
| 5,223,043 A | 6/1993 | Olson et al. |
| 5,234,790 A | 8/1993 | Lang et al. |
| 5,236,863 A | 8/1993 | Iranmanesh |
| 5,244,817 A | 9/1993 | Hawkins et al. |
| 5,296,045 A | 3/1994 | Banerjee et al. |
| 5,309,275 A | 5/1994 | Nishimura et al. |
| 5,322,988 A | 6/1994 | Russell et al. |
| 5,346,850 A | 9/1994 | Kaschmitter et al. |
| 5,351,446 A | 10/1994 | Langsdorf |
| 5,370,747 A | 12/1994 | Noguchi et al. |
| 5,373,182 A | 12/1994 | Norton |
| 5,381,431 A | 1/1995 | Zayhowski |
| 5,383,217 A | 1/1995 | Uemura |
| 5,390,201 A | 2/1995 | Tomono et al. |
| 5,410,168 A | 4/1995 | Hisa |
| 5,413,100 A | 5/1995 | Barthelemy et al. |
| 5,449,626 A | 9/1995 | Hezel |
| 5,454,347 A | 10/1995 | Shibata et al. |
| 5,502,329 A | 3/1996 | Pezzani |
| 5,507,881 A | 4/1996 | Sichanugrist et al. |
| 5,523,570 A | 6/1996 | Hairston |
| 5,559,361 A | 9/1996 | Pezzani |
| 5,569,615 A | 10/1996 | Yamazaki et al. |
| 5,569,624 A | 10/1996 | Weiner |
| 5,578,858 A | 11/1996 | Mueller et al. |
| 5,580,615 A | 12/1996 | Itoh et al. |
| 5,583,704 A | 12/1996 | Fujii |
| 5,589,008 A | 12/1996 | Kepper |
| 5,589,704 A | 12/1996 | Levine |
| 5,597,621 A | 1/1997 | Hummel et al. |
| 5,600,130 A | 2/1997 | VanZeghbroeck |
| 5,626,687 A | 5/1997 | Campbell |
| 5,627,081 A | 5/1997 | Tsuo et al. |
| 5,635,089 A | 6/1997 | Singh et al. |
| 5,640,013 A | 6/1997 | Ishikawa et al. |
| 5,641,362 A | 6/1997 | Meier |
| 5,641,969 A | 6/1997 | Cooke et al. |
| 5,705,413 A | 1/1998 | Harkin et al. |
| 5,705,828 A | 1/1998 | Noguchi et al. |
| 5,708,486 A | 1/1998 | Miyawaki et al. |
| 5,710,442 A | 1/1998 | Watanabe et al. |
| 5,714,404 A | 2/1998 | Mititsky et al. |
| 5,727,096 A | 3/1998 | Ghirardi et al. |
| 5,731,213 A | 3/1998 | Ono |
| 5,751,005 A | 5/1998 | Wyles et al. |
| 5,758,644 A | 6/1998 | Diab et al. |
| 5,766,127 A | 6/1998 | Pologe et al. |
| 5,766,964 A | 6/1998 | Rohatgi et al. |
| 5,773,820 A | 6/1998 | Osajda et al. |
| 5,779,631 A | 7/1998 | Chance |
| 5,781,392 A | 7/1998 | Clark |
| 5,792,280 A | 8/1998 | Ruby et al. |
| 5,802,091 A | 9/1998 | Chakrabarti et al. |
| 5,808,350 A | 9/1998 | Jack et al. |
| 5,859,446 A | 1/1999 | Nagasu et al. |
| 5,861,639 A | 1/1999 | Bernier |
| 5,871,826 A | 2/1999 | Mei |
| 5,898,672 A | 4/1999 | Ginzboorg |
| 5,918,140 A | 6/1999 | Wickboldt et al. |
| 5,923,071 A | 7/1999 | Saito |
| 5,935,320 A | 8/1999 | Graf et al. |
| 5,942,789 A | 8/1999 | Morikawa |

(56) References Cited

U.S. PATENT DOCUMENTS

| | | |
|---|---|---|
| 5,943,584 A | 8/1999 | Shim et al. |
| 5,963,790 A | 10/1999 | Matsuno et al. |
| 5,977,515 A | 11/1999 | Uraki et al. |
| 5,977,603 A | 11/1999 | Ishikawa |
| 5,995,606 A | 11/1999 | Civanlar et al. |
| 6,019,796 A | 2/2000 | Mei |
| 6,048,588 A | 4/2000 | Engelsberg |
| 6,049,058 A | 4/2000 | Dulaney et al. |
| 6,071,796 A | 6/2000 | Voutsas |
| 6,072,117 A | 6/2000 | Matsuyama et al. |
| 6,080,988 A | 6/2000 | Ishizuya et al. |
| 6,082,858 A | 7/2000 | Grace et al. |
| 6,097,031 A | 8/2000 | Cole |
| 6,106,689 A | 8/2000 | Matsuyama |
| 6,107,618 A | 8/2000 | Fossum et al. |
| 6,111,300 A | 8/2000 | Cao et al. |
| 6,117,499 A | 9/2000 | Wong et al. |
| 6,121,130 A | 9/2000 | Chua et al. |
| 6,128,379 A | 10/2000 | Smyk |
| 6,131,511 A | 10/2000 | Wachi et al. |
| 6,131,512 A | 10/2000 | Verlinden et al. |
| 6,147,297 A | 11/2000 | Wettling et al. |
| 6,160,833 A | 12/2000 | Floyd et al. |
| 6,168,965 B1 | 1/2001 | Malinovich et al. |
| 6,194,722 B1 | 2/2001 | Fiorini et al. |
| 6,204,506 B1 | 3/2001 | Akahori et al. |
| 6,229,192 B1 | 5/2001 | Gu |
| 6,242,291 B1 | 6/2001 | Kusumoto et al. |
| 6,252,256 B1 | 6/2001 | Ugge et al. |
| 6,272,768 B1 | 8/2001 | Danese |
| 6,290,713 B1 | 9/2001 | Russell |
| 6,291,302 B1 | 9/2001 | Yu |
| 6,313,901 B1 | 11/2001 | Cacharelis |
| 6,320,296 B1 | 11/2001 | Fujii et al. |
| 6,327,022 B1 | 12/2001 | Nishi |
| 6,331,445 B1 | 12/2001 | Janz et al. |
| 6,331,885 B1 | 12/2001 | Nishi |
| 6,333,485 B1 | 12/2001 | Haight et al. |
| 6,340,281 B1 | 1/2002 | Haraguchi |
| 6,372,536 B1 | 4/2002 | Fischer et al. |
| 6,372,591 B1 | 4/2002 | Mineji et al. |
| 6,372,611 B1 | 4/2002 | Horikawa |
| 6,379,979 B1 | 4/2002 | Connolly |
| 6,420,706 B1 | 7/2002 | Lurie et al. |
| 6,429,036 B1 | 8/2002 | Nixon et al. |
| 6,429,037 B1 | 8/2002 | Wenham et al. |
| 6,457,478 B1 | 10/2002 | Danese |
| 6,465,860 B2 | 10/2002 | Shigenaka et al. |
| 6,475,839 B2 | 11/2002 | Zhang et al. |
| 6,479,093 B2 | 11/2002 | Lauffer et al. |
| 6,483,116 B1 | 11/2002 | Kozlowski et al. |
| 6,483,929 B1 | 11/2002 | Marakami et al. |
| 6,486,046 B2 | 11/2002 | Fujimura et al. |
| 6,486,522 B1 | 11/2002 | Bishay et al. |
| 6,493,567 B1 | 12/2002 | Krivitski et al. |
| 6,498,336 B1 | 12/2002 | Tian et al. |
| 6,500,690 B1 | 12/2002 | Yamagishi et al. |
| 6,504,178 B2 | 1/2003 | Carlson et al. |
| 6,562,705 B1 | 5/2003 | Obara |
| 6,580,053 B1 | 6/2003 | Voutsas |
| 6,583,936 B1 | 6/2003 | Kaminsky et al. |
| 6,586,318 B1 | 7/2003 | Lu |
| 6,597,025 B2 | 7/2003 | Lauter et al. |
| 6,607,927 B2 | 8/2003 | Ramappa et al. |
| 6,624,049 B1 | 9/2003 | Yamazaki |
| 6,639,253 B2 | 10/2003 | Duane et al. |
| 6,653,554 B2 | 11/2003 | Ishihara |
| 6,667,528 B2 | 12/2003 | Cohen et al. |
| 6,677,655 B2 | 1/2004 | Fitzergald |
| 6,677,656 B2 | 1/2004 | Francois |
| 6,683,326 B2 | 1/2004 | Iguchi et al. |
| 6,689,209 B2 | 2/2004 | Falster et al. |
| 6,690,968 B2 | 2/2004 | Mejia |
| 6,734,455 B2 | 5/2004 | Li |
| 6,753,585 B1 | 6/2004 | Kindt |
| 6,756,104 B2 | 6/2004 | Sokol et al. |
| 6,759,262 B2 | 7/2004 | Theil et al. |
| 6,790,701 B2 | 9/2004 | Shigenaka et al. |
| 6,796,144 B2 | 9/2004 | Shepard et al. |
| 6,800,541 B2 | 10/2004 | Okumura |
| 6,801,799 B2 | 10/2004 | Mendelson |
| 6,803,555 B1 | 10/2004 | Parrish et al. |
| 6,815,685 B2 | 11/2004 | Wany |
| 6,818,535 B2 | 11/2004 | Lu et al. |
| 6,822,313 B2 | 11/2004 | Matsushita |
| 6,825,057 B1 | 11/2004 | Heyers et al. |
| 6,864,156 B1 | 3/2005 | Conn |
| 6,864,190 B2 | 3/2005 | Han et al. |
| 6,867,806 B1 | 3/2005 | Lee et al. |
| 6,876,003 B1 | 4/2005 | Nakamura et al. |
| 6,897,118 B1 | 5/2005 | Poon et al. |
| 6,900,839 B1 | 5/2005 | Kozlowski et al. |
| 6,907,135 B2 | 6/2005 | Gifford |
| 6,911,375 B2 | 6/2005 | Guarini et al. |
| 6,919,587 B2 | 7/2005 | Ballon et al. |
| 6,923,625 B2 | 8/2005 | Sparks |
| 6,927,432 B2 | 8/2005 | Holm et al. |
| 6,984,816 B2 | 1/2006 | Holm et al. |
| 7,008,854 B2 | 3/2006 | Forbes |
| 7,041,525 B2 | 5/2006 | Clevenger et al. |
| 7,057,256 B2 | 6/2006 | Carey, III et al. |
| 7,075,079 B2 | 7/2006 | Wood |
| 7,091,411 B2 | 8/2006 | Falk et al. |
| 7,109,517 B2 | 9/2006 | Zaidi |
| 7,112,545 B1 | 9/2006 | Railkar et al. |
| 7,126,212 B2 | 10/2006 | Enquist et al. |
| 7,132,724 B1 | 11/2006 | Merrill |
| 7,202,102 B2 | 4/2007 | Yao |
| 7,211,214 B2 | 5/2007 | Chou |
| 7,211,501 B2 | 5/2007 | Liu et al. |
| 7,235,812 B2 | 6/2007 | Chu et al. |
| 7,247,527 B2 | 7/2007 | Shimomura et al. |
| 7,247,812 B2 | 7/2007 | Tsao |
| 7,256,102 B2 | 8/2007 | Nakata et al. |
| 7,271,445 B2 | 9/2007 | Forbes |
| 7,271,835 B2 | 9/2007 | Iizuka et al. |
| 7,285,482 B2 | 10/2007 | Ochi |
| 7,314,832 B2 | 1/2008 | Kountz et al. |
| 7,315,014 B2 | 1/2008 | Lee et al. |
| 7,354,792 B2 | 4/2008 | Carey, III et al. |
| 7,358,498 B2 | 4/2008 | Geng et al. |
| 7,375,378 B2 | 5/2008 | Manivannan et al. |
| 7,390,689 B2 | 6/2008 | Mazur et al. |
| 7,413,909 B2 | 8/2008 | Hutchens et al. |
| 7,425,471 B2 | 9/2008 | Bruland et al. |
| 7,432,148 B2 | 10/2008 | Li et al. |
| 7,442,629 B2 | 10/2008 | Mazur et al. |
| 7,446,359 B2 | 11/2008 | Lee et al. |
| 7,446,807 B2 | 11/2008 | Hong |
| 7,456,452 B2 | 11/2008 | Wells et al. |
| 7,482,532 B2 | 1/2009 | Yi et al. |
| 7,498,650 B2 | 3/2009 | Lauxtermann |
| 7,504,325 B2 | 3/2009 | Koezuka et al. |
| 7,504,702 B2 | 3/2009 | Mazur et al. |
| 7,511,750 B2 | 3/2009 | Murakami |
| 7,521,737 B2 | 4/2009 | Augusto |
| 7,528,463 B2 | 5/2009 | Forbes |
| 7,542,085 B2 | 6/2009 | Altice, Jr. et al. |
| 7,547,616 B2 | 6/2009 | Fogel et al. |
| 7,551,059 B2 | 6/2009 | Farrier |
| 7,560,750 B2 | 7/2009 | Niira et al. |
| 7,564,631 B2 | 7/2009 | Li et al. |
| 7,569,503 B2 | 8/2009 | Pan |
| 7,582,515 B2 | 9/2009 | Choi et al. |
| 7,586,601 B2 | 9/2009 | Ebstein |
| 7,592,593 B2 | 9/2009 | Kauffman et al. |
| 7,595,213 B2 | 9/2009 | Kwon et al. |
| 7,605,064 B2 | 10/2009 | Kizilyalli et al. |
| 7,605,397 B2 | 10/2009 | Kindem et al. |
| 7,615,808 B2 | 11/2009 | Pain et al. |
| 7,618,839 B2 | 11/2009 | Rhodes |
| 7,619,269 B2 | 11/2009 | Ohkawa |
| 7,629,234 B2 | 12/2009 | Bruland |
| 7,629,582 B2 | 12/2009 | Hoffman et al. |

(56) References Cited

U.S. PATENT DOCUMENTS

| | | |
|---|---|---|
| 7,648,851 B2 | 1/2010 | Fu et al. |
| 7,649,156 B2 | 1/2010 | Lee |
| 7,687,740 B2 | 3/2010 | Bruland et al. |
| 7,705,879 B2 | 4/2010 | Kerr et al. |
| 7,728,274 B2 | 6/2010 | Pilla et al. |
| 7,731,665 B2 | 6/2010 | Lee et al. |
| 7,741,666 B2 | 6/2010 | Nozaki et al. |
| 7,745,901 B1 | 6/2010 | McCaffrey et al. |
| 7,763,913 B2 | 7/2010 | Fan et al. |
| 7,772,028 B2 | 8/2010 | Adkisson et al. |
| 7,781,856 B2 | 8/2010 | Mazur et al. |
| 7,800,192 B2 | 9/2010 | Venezia et al. |
| 7,800,684 B2 | 9/2010 | Tatani |
| 7,816,220 B2 | 10/2010 | Mazur et al. |
| 7,828,983 B2 | 11/2010 | Weber et al. |
| 7,847,253 B2 | 12/2010 | Carey et al. |
| 7,847,326 B2 | 12/2010 | Park et al. |
| 7,855,406 B2 | 12/2010 | Yamaguchi et al. |
| 7,875,498 B2 | 1/2011 | Elbanhawy et al. |
| 7,880,168 B2 | 2/2011 | Lenchenkov |
| 7,884,439 B2 | 2/2011 | Mazur et al. |
| 7,884,446 B2 | 2/2011 | Mazur et al. |
| 7,897,942 B1 | 3/2011 | Bareket |
| 7,910,964 B2 | 3/2011 | Kawahito et al. |
| 7,923,801 B2 | 4/2011 | Tian et al. |
| 7,935,941 B2 | 5/2011 | Bruland et al. |
| 7,968,834 B2 | 6/2011 | Veeder |
| 8,008,205 B2 | 8/2011 | Fukushima et al. |
| 8,013,411 B2 | 9/2011 | Cole |
| 8,030,726 B2 | 10/2011 | Sumi |
| 8,035,343 B2 | 10/2011 | Seman, Jr. |
| 8,058,615 B2 | 11/2011 | McCaffrey |
| 8,076,746 B2 | 12/2011 | McCarten et al. |
| 8,080,467 B2 | 12/2011 | Carey et al. |
| 8,088,219 B2 | 1/2012 | Knerer et al. |
| 8,093,559 B1 | 1/2012 | Rajavel |
| RE43,169 E | 2/2012 | Parker |
| 8,164,126 B2 | 4/2012 | Moon et al. |
| 8,207,051 B2 | 6/2012 | Sickler et al. |
| 8,247,259 B2 | 8/2012 | Grolier et al. |
| 8,259,293 B2 | 9/2012 | Andreou et al. |
| 8,268,403 B2 | 9/2012 | Akiyama et al. |
| 8,288,702 B2 | 10/2012 | Veeder |
| 8,355,545 B2 | 1/2013 | Corcoran et al. |
| 8,445,950 B2 | 5/2013 | Iida et al. |
| 8,445,985 B2 | 5/2013 | Hiyama et al. |
| 8,456,546 B2 | 6/2013 | Oike |
| 8,470,619 B2 | 6/2013 | Bour |
| 8,476,681 B2 | 7/2013 | Haddad et al. |
| 8,530,264 B2 | 9/2013 | De Munck et al. |
| 8,564,087 B2 | 10/2013 | Yamamura et al. |
| 8,603,902 B2 | 12/2013 | Mazer et al. |
| 8,604,405 B2 | 12/2013 | Liu et al. |
| 8,629,485 B2 | 1/2014 | Yamamura et al. |
| 8,649,568 B2 | 2/2014 | Sato |
| 8,680,591 B2 | 3/2014 | Haddad et al. |
| 8,698,272 B2 | 4/2014 | Vineis |
| 8,729,678 B2 | 5/2014 | Shim et al. |
| 8,742,528 B2 | 6/2014 | Yamamura et al. |
| 8,884,226 B2 | 11/2014 | Miyazaki et al. |
| 8,906,670 B2 | 12/2014 | Gray |
| 8,916,945 B2 | 12/2014 | Sakamoto et al. |
| 8,928,784 B2 | 1/2015 | Watanabe et al. |
| 8,994,135 B2 | 6/2015 | Yamamura et al. |
| 9,064,762 B2 | 6/2015 | Yamaguchi |
| 9,184,204 B2 | 11/2015 | Hu |
| 9,190,551 B2 | 11/2015 | Yamamura et al. |
| 9,209,345 B2 | 12/2015 | Haddad |
| 9,276,143 B2 | 3/2016 | Mazur |
| 9,369,641 B2 | 6/2016 | Hu |
| 9,419,159 B2 | 8/2016 | Sakamoto et al. |
| 9,478,572 B2 | 10/2016 | Miyanami |
| 9,559,215 B1 | 1/2017 | Ahmed |
| 9,659,984 B2 | 5/2017 | Ohkubo et al. |
| 9,673,250 B2 | 6/2017 | Haddad et al. |
| 2001/0017344 A1 | 8/2001 | Aebi |
| 2001/0022768 A1 | 9/2001 | Takahashi |
| 2001/0044175 A1 | 11/2001 | Barrett et al. |
| 2001/0044251 A1 | 11/2001 | Cho et al. |
| 2001/0044266 A1 | 11/2001 | Katsuoka |
| 2002/0020893 A1 | 2/2002 | Lhorte |
| 2002/0024618 A1 | 2/2002 | Imai |
| 2002/0034845 A1 | 3/2002 | Fujimura et al. |
| 2002/0056845 A1 | 5/2002 | Iguchi et al. |
| 2002/0060322 A1 | 5/2002 | Tanabe et al. |
| 2002/0079290 A1 | 6/2002 | Holdermann |
| 2002/0117699 A1 | 8/2002 | Francois |
| 2002/0126333 A1 | 9/2002 | Hosono et al. |
| 2002/0148964 A1 | 10/2002 | Dausch et al. |
| 2002/0176650 A1 | 11/2002 | Zhao et al. |
| 2002/0182769 A1 | 12/2002 | Campbell |
| 2003/0016708 A1 | 1/2003 | Albrecht et al. |
| 2003/0024269 A1 | 2/2003 | Shepard et al. |
| 2003/0025156 A1 | 2/2003 | Yamazaki et al. |
| 2003/0029495 A1 | 2/2003 | Mazur et al. |
| 2003/0030083 A1 | 2/2003 | Lee et al. |
| 2003/0045074 A1 | 3/2003 | Seibel et al. |
| 2003/0045092 A1 | 3/2003 | Shin |
| 2003/0057357 A1 | 3/2003 | Uppal et al. |
| 2003/0111106 A1 | 6/2003 | Nagano et al. |
| 2003/0132449 A1 | 7/2003 | Hosono et al. |
| 2003/0183270 A1 | 10/2003 | Falk et al. |
| 2003/0210332 A1 | 11/2003 | Frame |
| 2003/0213515 A1 | 11/2003 | Sano et al. |
| 2003/0214595 A1 | 11/2003 | Mabuchi |
| 2003/0228883 A1 | 12/2003 | Kusakari et al. |
| 2004/0014307 A1 | 1/2004 | Shin et al. |
| 2004/0016886 A1 | 1/2004 | Ringermacher et al. |
| 2004/0041168 A1 | 3/2004 | Hembree et al. |
| 2004/0046224 A1 | 3/2004 | Rossel et al. |
| 2004/0077117 A1 | 4/2004 | Ding et al. |
| 2004/0080638 A1 | 4/2004 | Lee |
| 2004/0112426 A1 | 6/2004 | Hagino |
| 2004/0130020 A1 | 7/2004 | Kuwabara et al. |
| 2004/0161868 A1 | 8/2004 | Hong |
| 2004/0169834 A1 | 9/2004 | Richter et al. |
| 2004/0222187 A1 | 11/2004 | Lin |
| 2004/0252931 A1 | 12/2004 | Belleville et al. |
| 2004/0256561 A1 | 12/2004 | Beuhler et al. |
| 2005/0032249 A1 | 2/2005 | Im et al. |
| 2005/0040440 A1 | 2/2005 | Murakami |
| 2005/0051822 A1 | 3/2005 | Manning |
| 2005/0062041 A1 | 3/2005 | Terakawa et al. |
| 2005/0063566 A1 | 3/2005 | Beek et al. |
| 2005/0088634 A1 | 4/2005 | Kosugi |
| 2005/0093100 A1 | 5/2005 | Chen et al. |
| 2005/0101100 A1 | 5/2005 | Kretchmer et al. |
| 2005/0101160 A1 | 5/2005 | Garg et al. |
| 2005/0127401 A1 | 6/2005 | Mazur et al. |
| 2005/0134698 A1 | 6/2005 | Schroeder et al. |
| 2005/0150542 A1 | 7/2005 | Madan |
| 2005/0158969 A1 | 7/2005 | Binnis et al. |
| 2005/0184291 A1 | 8/2005 | Cole et al. |
| 2005/0184353 A1 | 8/2005 | Mouli |
| 2005/0211996 A1 | 9/2005 | Krishna et al. |
| 2005/0226287 A1 | 10/2005 | Shah et al. |
| 2005/0227390 A1 | 10/2005 | Shtein et al. |
| 2005/0227457 A1 | 10/2005 | Kondo et al. |
| 2006/0006482 A1 | 1/2006 | Rieve et al. |
| 2006/0011954 A1 | 1/2006 | Ueda et al. |
| 2006/0011955 A1 | 1/2006 | Baggenstoss |
| 2006/0060848 A1 | 3/2006 | Chang et al. |
| 2006/0071254 A1 | 4/2006 | Rhodes |
| 2006/0079062 A1 | 4/2006 | Mazur et al. |
| 2006/0086956 A1 | 4/2006 | Furukawa et al. |
| 2006/0097172 A1 | 5/2006 | Park |
| 2006/0097290 A1 | 5/2006 | Hietanen |
| 2006/0102901 A1 | 5/2006 | Im et al. |
| 2006/0118781 A1 | 6/2006 | Rhodes |
| 2006/0121680 A1 | 6/2006 | Tanaka |
| 2006/0128087 A1 | 6/2006 | Bamji et al. |
| 2006/0132633 A1 | 6/2006 | Nam et al. |
| 2006/0138396 A1 | 6/2006 | Lin et al. |
| 2006/0145148 A1 | 7/2006 | Hirai et al. |

(56) References Cited

U.S. PATENT DOCUMENTS

| | | |
|---|---|---|
| 2006/0145176 A1 | 7/2006 | Lee |
| 2006/0160343 A1 | 7/2006 | Chong et al. |
| 2006/0166475 A1 | 7/2006 | Mantl |
| 2006/0175529 A1 | 8/2006 | Harmon et al. |
| 2006/0180885 A1 | 8/2006 | Rhodes |
| 2006/0181627 A1 | 8/2006 | Farrier |
| 2006/0210122 A1 | 9/2006 | Cleveland |
| 2006/0214121 A1 | 9/2006 | Schrey et al. |
| 2006/0228897 A1 | 10/2006 | Timans |
| 2006/0231853 A1 | 10/2006 | Tanaka |
| 2006/0231914 A1 | 10/2006 | Carey et al. |
| 2006/0238632 A1 | 10/2006 | Shah |
| 2006/0244090 A1 | 11/2006 | Roy et al. |
| 2006/0255340 A1 | 11/2006 | Manivannan et al. |
| 2006/0257140 A1 | 11/2006 | Seger |
| 2007/0035849 A1 | 2/2007 | Li et al. |
| 2007/0035879 A1 | 2/2007 | Hall et al. |
| 2007/0051876 A1 | 3/2007 | Sumi et al. |
| 2007/0052050 A1 | 3/2007 | Dierickx |
| 2007/0063219 A1 | 3/2007 | Sa'ar et al. |
| 2007/0076481 A1 | 4/2007 | Tennant |
| 2007/0102709 A1 | 5/2007 | Burgener et al. |
| 2007/0103580 A1 | 5/2007 | Noto |
| 2007/0115554 A1 | 5/2007 | Breitung et al. |
| 2007/0123005 A1 | 5/2007 | Hiura et al. |
| 2007/0125951 A1 | 6/2007 | Snider et al. |
| 2007/0131275 A1 | 6/2007 | Kinsey et al. |
| 2007/0138590 A1 | 6/2007 | Wells et al. |
| 2007/0145505 A1 | 6/2007 | Kim et al. |
| 2007/0178672 A1 | 8/2007 | Tanaka et al. |
| 2007/0187670 A1 | 8/2007 | Hsu et al. |
| 2007/0189583 A1 | 8/2007 | Shimada et al. |
| 2007/0194356 A1 | 8/2007 | Moon et al. |
| 2007/0194401 A1 | 8/2007 | Nagai et al. |
| 2007/0195056 A1 | 8/2007 | Lloyd |
| 2007/0200940 A1 | 8/2007 | Gruhlke et al. |
| 2007/0201859 A1 | 8/2007 | Sarrat |
| 2007/0235827 A1 | 10/2007 | Altice |
| 2007/0237504 A1 | 10/2007 | Nakashiba |
| 2007/0243701 A1 | 10/2007 | Ito et al. |
| 2007/0247414 A1 | 10/2007 | Roberts |
| 2007/0262366 A1 | 11/2007 | Baek et al. |
| 2007/0290283 A1 | 12/2007 | Park et al. |
| 2007/0293056 A1 | 12/2007 | Setsuhara et al. |
| 2007/0296060 A1 | 12/2007 | Tanabe et al. |
| 2007/0298533 A1 | 12/2007 | Yang et al. |
| 2008/0002863 A1 | 1/2008 | Northcott |
| 2008/0020555 A1 | 1/2008 | Shimomura et al. |
| 2008/0026550 A1 | 1/2008 | Werner et al. |
| 2008/0036022 A1 | 2/2008 | Hwang et al. |
| 2008/0044943 A1 | 2/2008 | Mazur et al. |
| 2008/0076240 A1 | 3/2008 | Veschetti et al. |
| 2008/0099804 A1 | 5/2008 | Venezia et al. |
| 2008/0121280 A1 | 5/2008 | Carnel et al. |
| 2008/0121805 A1 | 5/2008 | Tweet et al. |
| 2008/0135099 A1 | 6/2008 | Yu |
| 2008/0142686 A1 | 6/2008 | Konno et al. |
| 2008/0158398 A1 | 7/2008 | Yaffe et al. |
| 2008/0170173 A1 | 7/2008 | Park et al. |
| 2008/0173620 A1 | 7/2008 | Grek |
| 2008/0174685 A1 | 7/2008 | Shan et al. |
| 2008/0178932 A1 | 7/2008 | Den Boer et al. |
| 2008/0179762 A1 | 7/2008 | Cho et al. |
| 2008/0191296 A1 | 8/2008 | Wang et al. |
| 2008/0191310 A1 | 8/2008 | Wu et al. |
| 2008/0192132 A1 | 8/2008 | Bechtel et al. |
| 2008/0192133 A1 | 8/2008 | Abiru et al. |
| 2008/0196761 A1 | 8/2008 | Nakano et al. |
| 2008/0198251 A1 | 8/2008 | Xu et al. |
| 2008/0202576 A1 | 8/2008 | Hieslmair |
| 2008/0213936 A1 | 9/2008 | Hatai |
| 2008/0223436 A1 | 9/2008 | den Boer et al. |
| 2008/0242005 A1 | 10/2008 | Dozen et al. |
| 2008/0251812 A1 | 10/2008 | Yoo |
| 2008/0257409 A1 | 10/2008 | Li et al. |
| 2008/0258604 A1 | 10/2008 | Mazur et al. |
| 2008/0266434 A1 | 10/2008 | Sugawa et al. |
| 2008/0266435 A1 | 10/2008 | Agranov et al. |
| 2008/0281174 A1 | 11/2008 | Dietiker |
| 2008/0284884 A1 | 11/2008 | Makino et al. |
| 2008/0303932 A1 | 12/2008 | Wang et al. |
| 2008/0309913 A1 | 12/2008 | Fallon |
| 2009/0002528 A1 | 1/2009 | Manabe et al. |
| 2009/0009596 A1 | 1/2009 | Kerr et al. |
| 2009/0014056 A1 | 1/2009 | Hockaday |
| 2009/0027640 A1 | 1/2009 | Shibazaki |
| 2009/0036783 A1 | 2/2009 | Kishima |
| 2009/0038669 A1 | 2/2009 | Atanackovic |
| 2009/0039397 A1 | 2/2009 | Chao |
| 2009/0050944 A1 | 2/2009 | Hong |
| 2009/0056797 A1 | 3/2009 | Barnett et al. |
| 2009/0057536 A1 | 3/2009 | Hirose |
| 2009/0065051 A1 | 3/2009 | Chan et al. |
| 2009/0078316 A1 | 3/2009 | Khazeni et al. |
| 2009/0090988 A1 | 4/2009 | Ohgishi |
| 2009/0095887 A1 | 4/2009 | Saveliev |
| 2009/0096049 A1 | 4/2009 | Oshiyama et al. |
| 2009/0101197 A1 | 4/2009 | Morikawa |
| 2009/0109305 A1 | 4/2009 | Dai et al. |
| 2009/0114630 A1 | 5/2009 | Hawryluk |
| 2009/0142879 A1 | 6/2009 | Isaka et al. |
| 2009/0146240 A1 | 6/2009 | Carey, III et al. |
| 2009/0151785 A1 | 6/2009 | Naum et al. |
| 2009/0160983 A1 | 6/2009 | Lenchenkov |
| 2009/0174026 A1 | 7/2009 | Carey et al. |
| 2009/0179199 A1 | 7/2009 | Sano et al. |
| 2009/0180010 A1 | 7/2009 | Adikisson et al. |
| 2009/0194671 A1 | 8/2009 | Nozaki et al. |
| 2009/0200454 A1 | 8/2009 | Barbier et al. |
| 2009/0200586 A1 | 8/2009 | Mao et al. |
| 2009/0200625 A1 | 8/2009 | Venezia et al. |
| 2009/0200626 A1 | 8/2009 | Qian et al. |
| 2009/0200631 A1 | 8/2009 | Tai et al. |
| 2009/0206237 A1 | 8/2009 | Shannon et al. |
| 2009/0211627 A1 | 8/2009 | Meier et al. |
| 2009/0213883 A1 | 8/2009 | Mazur et al. |
| 2009/0218493 A1 | 9/2009 | McCaffrey et al. |
| 2009/0223561 A1 | 9/2009 | Kim et al. |
| 2009/0227061 A1 | 9/2009 | Bateman et al. |
| 2009/0242019 A1 | 10/2009 | Ramamoorthy et al. |
| 2009/0242032 A1 | 10/2009 | Yamazaki et al. |
| 2009/0242933 A1 | 10/2009 | Hu et al. |
| 2009/0256156 A1 | 10/2009 | Hsieh |
| 2009/0256226 A1 | 10/2009 | Tatani |
| 2009/0261255 A1 | 10/2009 | Nakamura et al. |
| 2009/0273695 A1 | 11/2009 | Mabuchi |
| 2009/0278967 A1 | 11/2009 | Toumiya |
| 2009/0283807 A1 | 11/2009 | Adkisson et al. |
| 2009/0294787 A1 | 12/2009 | Nakaji et al. |
| 2009/0308450 A1 | 12/2009 | Adibi et al. |
| 2009/0308457 A1 | 12/2009 | Smith et al. |
| 2010/0000597 A1 | 1/2010 | Cousins |
| 2010/0013036 A1 | 1/2010 | Carey |
| 2010/0013039 A1 | 1/2010 | Qian et al. |
| 2010/0013593 A1 | 1/2010 | Luckhardt |
| 2010/0024871 A1 | 2/2010 | Oh et al. |
| 2010/0032008 A1 | 2/2010 | Adekore |
| 2010/0037952 A1 | 2/2010 | Lin |
| 2010/0038523 A1 | 2/2010 | Venezia et al. |
| 2010/0038542 A1 | 2/2010 | Carey et al. |
| 2010/0040981 A1 | 2/2010 | Kiesel et al. |
| 2010/0044552 A1 | 2/2010 | Chen |
| 2010/0051809 A1 | 3/2010 | Onat et al. |
| 2010/0052088 A1 | 3/2010 | Carey |
| 2010/0053382 A1 | 3/2010 | Kuniba |
| 2010/0055887 A1 | 3/2010 | Piwczyk |
| 2010/0059385 A1 | 3/2010 | Li |
| 2010/0059803 A1 | 3/2010 | Gidon et al. |
| 2010/0072349 A1 | 3/2010 | Veeder |
| 2010/0074396 A1 | 3/2010 | Schmand et al. |
| 2010/0083997 A1 | 4/2010 | Hovel |
| 2010/0084009 A1 | 4/2010 | Carlson et al. |
| 2010/0096718 A1 | 4/2010 | Hynecek et al. |
| 2010/0097609 A1 | 4/2010 | Jaeger et al. |

(56) References Cited

U.S. PATENT DOCUMENTS

| | | |
|---|---|---|
| 2010/0102206 A1 | 4/2010 | Cazaux et al. |
| 2010/0102366 A1 | 4/2010 | Lee et al. |
| 2010/0108864 A1 | 5/2010 | Ohta et al. |
| 2010/0109060 A1 | 5/2010 | Mao et al. |
| 2010/0116312 A1 | 5/2010 | Peumans et al. |
| 2010/0117181 A1 | 5/2010 | Kim et al. |
| 2010/0118172 A1 | 5/2010 | McCarten et al. |
| 2010/0128161 A1 | 5/2010 | Yamaguchi |
| 2010/0128937 A1 | 5/2010 | Yoo et al. |
| 2010/0133635 A1 | 6/2010 | Lee et al. |
| 2010/0140733 A1 | 6/2010 | Lee et al. |
| 2010/0140768 A1 | 6/2010 | Zafiropoulo |
| 2010/0143744 A1 | 6/2010 | Gupta |
| 2010/0147383 A1 | 6/2010 | Carey et al. |
| 2010/0171948 A1 | 7/2010 | Mazur et al. |
| 2010/0190292 A1 | 7/2010 | Alberts |
| 2010/0200658 A1 | 8/2010 | Olmstead et al. |
| 2010/0201834 A1 | 8/2010 | Maruyama et al. |
| 2010/0213582 A9 | 8/2010 | Couillard et al. |
| 2010/0219506 A1 | 9/2010 | Gupta et al. |
| 2010/0224229 A1 | 9/2010 | Pralle et al. |
| 2010/0240169 A1 | 9/2010 | Petti et al. |
| 2010/0245647 A1 | 9/2010 | Honda et al. |
| 2010/0258176 A1 | 10/2010 | Kang et al. |
| 2010/0264473 A1 | 10/2010 | Adkisson et al. |
| 2010/0289885 A1 | 11/2010 | Lu et al. |
| 2010/0290668 A1 | 11/2010 | Friedman et al. |
| 2010/0300505 A1 | 12/2010 | Chen |
| 2010/0300507 A1 | 12/2010 | Heng et al. |
| 2010/0313932 A1 | 12/2010 | Kroll et al. |
| 2011/0003424 A1 | 1/2011 | De Ceuster et al. |
| 2011/0019050 A1 | 1/2011 | Yamashita |
| 2011/0025842 A1 | 2/2011 | King et al. |
| 2011/0056544 A1 | 3/2011 | Ji et al. |
| 2011/0073976 A1 | 3/2011 | Vaillant |
| 2011/0095387 A1 | 4/2011 | Carey et al. |
| 2011/0104850 A1 | 5/2011 | Weidman et al. |
| 2011/0127567 A1 | 6/2011 | Seong |
| 2011/0140221 A1 | 6/2011 | Venezia et al. |
| 2011/0150304 A1 | 6/2011 | Abe et al. |
| 2011/0194100 A1 | 8/2011 | Thiel et al. |
| 2011/0220971 A1 | 9/2011 | Haddad |
| 2011/0227138 A1 | 9/2011 | Haddad |
| 2011/0241148 A1 | 10/2011 | Hiyama et al. |
| 2011/0241152 A1 | 10/2011 | Hsiao et al. |
| 2011/0251478 A1 | 10/2011 | Wieczorek |
| 2011/0260059 A1 | 10/2011 | Jiang et al. |
| 2011/0266644 A1 | 11/2011 | Yamamura et al. |
| 2011/0292380 A1 | 12/2011 | Bamji |
| 2011/0303999 A1 | 12/2011 | Sakamoto et al. |
| 2012/0001841 A1 | 1/2012 | Gokingco et al. |
| 2012/0024363 A1 | 2/2012 | Dimer et al. |
| 2012/0024364 A1 | 2/2012 | Carey, III et al. |
| 2012/0025199 A1 | 2/2012 | Chen et al. |
| 2012/0038811 A1 | 2/2012 | Ellis-monaghan et al. |
| 2012/0043637 A1 | 2/2012 | King et al. |
| 2012/0049242 A1 | 3/2012 | Atanackovic et al. |
| 2012/0049306 A1 | 3/2012 | Ohba et al. |
| 2012/0080733 A1 | 4/2012 | Doan et al. |
| 2012/0111396 A1 | 5/2012 | Saylor et al. |
| 2012/0147241 A1 | 6/2012 | Yamaguchi |
| 2012/0153127 A1 | 6/2012 | Hirigoyen et al. |
| 2012/0153128 A1 | 6/2012 | Roy et al. |
| 2012/0171804 A1 | 7/2012 | Moslehi et al. |
| 2012/0187190 A1 | 7/2012 | Wang et al. |
| 2012/0188431 A1 | 7/2012 | Takimoto |
| 2012/0217602 A1 | 8/2012 | Enomoto |
| 2012/0222396 A1 | 9/2012 | Clemen |
| 2012/0228473 A1 | 9/2012 | Yoshitsugu |
| 2012/0274744 A1 | 11/2012 | Wan et al. |
| 2012/0291859 A1 | 11/2012 | Vineis et al. |
| 2012/0300037 A1 | 11/2012 | Laudo |
| 2012/0305063 A1 | 12/2012 | Moslehi et al. |
| 2012/0312304 A1 | 12/2012 | Lynch et al. |
| 2012/0313204 A1 | 12/2012 | Haddad et al. |
| 2012/0313205 A1 | 12/2012 | Haddad et al. |
| 2012/0326008 A1 | 12/2012 | Mckee et al. |
| 2013/0001553 A1 | 1/2013 | Vineis et al. |
| 2013/0020468 A1 | 1/2013 | Mitsuhashi et al. |
| 2013/0026531 A1 | 1/2013 | Seo et al. |
| 2013/0082343 A1 | 4/2013 | Fudaba et al. |
| 2013/0135439 A1 | 5/2013 | Kakuko et al. |
| 2013/0168792 A1 | 7/2013 | Haddad et al. |
| 2013/0168803 A1 | 7/2013 | Haddad et al. |
| 2013/0200251 A1 | 8/2013 | Velichko |
| 2013/0207212 A1 | 8/2013 | Mao et al. |
| 2013/0207214 A1 | 8/2013 | Haddad et al. |
| 2013/0285130 A1 | 10/2013 | Ting |
| 2014/0054662 A1 | 2/2014 | Yanagita et al. |
| 2014/0198240 A1 | 7/2014 | Rhoads |
| 2014/0247378 A1 | 9/2014 | Sharma et al. |
| 2014/0352779 A1 | 12/2014 | Smirnov et al. |
| 2014/0374868 A1 | 12/2014 | Lee et al. |
| 2015/0076468 A1 | 3/2015 | Yamaguchi et al. |
| 2017/0141258 A1 | 5/2017 | McFarland |
| 2017/0244920 A1 | 8/2017 | Ohkubo et al. |

FOREIGN PATENT DOCUMENTS

| | | |
|---|---|---|
| CN | 1614789 | 5/2005 |
| CN | 101053065 A | 10/2007 |
| CN | 101241923 | 8/2008 |
| CN | 101404307 | 4/2009 |
| CN | 101423942 | 5/2009 |
| CN | 101465361 | 6/2009 |
| CN | 101478013 | 7/2009 |
| CN | 101634026 | 1/2010 |
| CN | 101634027 | 1/2010 |
| CN | 101740597 | 6/2010 |
| CN | 101818348 | 9/2010 |
| CN | 201725796 | 1/2011 |
| CN | 101978498 | 2/2011 |
| CN | 102270646 | 12/2011 |
| DE | 19838439 | 4/2000 |
| EP | 0473439 | 3/1992 |
| EP | 0566156 | 10/1993 |
| EP | 1347670 A1 | 9/2003 |
| EP | 1630871 | 1/2006 |
| EP | 1873840 | 1/2008 |
| EP | 2073270 | 5/2012 |
| EP | 2509107 | 10/2012 |
| FR | 2827707 | 1/2003 |
| GB | 2030766 | 4/1980 |
| JP | S5771188 | 5/1982 |
| JP | S57173966 | 10/1982 |
| JP | S63116421 | 5/1988 |
| JP | H02152226 | 6/1990 |
| JP | H02237026 | 9/1990 |
| JP | H03183037 | 8/1991 |
| JP | H04318970 | 11/1992 |
| JP | H06104414 | 4/1994 |
| JP | H06244444 | 9/1994 |
| JP | H06267868 | 9/1994 |
| JP | H06275641 | 9/1994 |
| JP | H0774240 | 3/1995 |
| JP | H07235658 | 5/1995 |
| JP | H07183484 | 7/1995 |
| JP | 9148594 | 6/1997 |
| JP | H09298308 | 11/1997 |
| JP | 11077348 | 3/1999 |
| JP | 11097724 | 4/1999 |
| JP | 2000164914 | 6/2000 |
| JP | 2001007381 | 1/2001 |
| JP | 2001024936 | 1/2001 |
| JP | 2001189478 | 7/2001 |
| JP | 2001257927 | 9/2001 |
| JP | 2001339057 | 12/2001 |
| JP | 2002043594 | 2/2002 |
| JP | 2002134640 | 5/2002 |
| JP | 2002190386 | 7/2002 |
| JP | 2003058269 | 2/2003 |

(56) References Cited

FOREIGN PATENT DOCUMENTS

| | | |
|---|---|---|
| JP | 2003104121 | 4/2003 |
| JP | 2003163360 | 6/2003 |
| JP | 2003242125 | 8/2003 |
| JP | 2003258285 | 9/2003 |
| JP | 2003308130 | 10/2003 |
| JP | 2004047682 | 2/2004 |
| JP | 2004273886 | 9/2004 |
| JP | 2004273887 | 9/2004 |
| JP | 2005339425 | 12/2005 |
| JP | 2006033493 | 2/2006 |
| JP | 2006147991 | 6/2006 |
| JP | 2006173381 | 6/2006 |
| JP | 2006210701 | 8/2006 |
| JP | 2006255430 | 9/2006 |
| JP | 2006261372 | 9/2006 |
| JP | 2007122237 | 5/2007 |
| JP | 2007165909 | 6/2007 |
| JP | 2007180642 | 7/2007 |
| JP | 2007180643 | 7/2007 |
| JP | 2007258684 | 10/2007 |
| JP | 2007305675 | 11/2007 |
| JP | 2008099158 | 4/2008 |
| JP | 2008167004 | 7/2008 |
| JP | 2008187003 | 8/2008 |
| JP | 2008283219 | 11/2008 |
| JP | 2008294698 | 12/2008 |
| JP | 2009021479 | 1/2009 |
| JP | 2009152569 | 7/2009 |
| JP | 2009253683 | 10/2009 |
| JP | 2010278472 | 12/2010 |
| JP | 2011003860 | 1/2011 |
| JP | 2011091128 | 5/2011 |
| JP | 2012054321 | 3/2012 |
| JP | 2012169530 | 9/2012 |
| JP | 2012191005 | 10/2012 |
| JP | 2012212349 | 11/2012 |
| KR | 20010061058 | 4/2001 |
| KR | 2005039273 | 4/2005 |
| KR | 20060020400 | 3/2006 |
| KR | 20080014301 | 2/2008 |
| KR | 100825808 | 4/2008 |
| KR | 20080097709 | 11/2008 |
| KR | 20090077274 | 7/2009 |
| KR | 20100026463 | 3/2010 |
| KR | 20100118864 | 11/2010 |
| KR | 20110079323 | 7/2011 |
| KR | 20060052278 | 5/2016 |
| KR | 20170070266 | 6/2017 |
| TW | 200627675 | 8/2006 |
| TW | 200818529 | 4/2008 |
| WO | WO 91/14284 | 9/1991 |
| WO | WO 2000031679 | 6/2000 |
| WO | WO 0131842 | 3/2001 |
| WO | WO 0135601 | 5/2001 |
| WO | WO 2002041363 | 5/2002 |
| WO | WO 03/059390 | 7/2003 |
| WO | WO 2003059390 | 7/2003 |
| WO | WO 2005029599 | 3/2005 |
| WO | WO 2006054758 | 5/2006 |
| WO | WO 2008091242 | 7/2008 |
| WO | WO 2008099524 | 8/2008 |
| WO | WO 2008145097 | 12/2008 |
| WO | WO 2009016846 | 2/2009 |
| WO | WO 2009100023 | 8/2009 |
| WO | WO 2009147085 | 12/2009 |
| WO | WO 2010033127 | 3/2010 |
| WO | WO 2011003871 | 1/2011 |
| WO | WO 2011035188 | 3/2011 |
| WO | WO 2011119618 | 3/2011 |
| WO | WO 2012027290 | 3/2012 |
| WO | WO 2012117931 | 9/2012 |
| WO | WO 2012174752 | 12/2012 |
| WO | WO 2006/086014 | 8/2016 |

OTHER PUBLICATIONS

Asom et al., Interstitial Defect Reactions in Silicon; Appl. Phys. Lett.; Jul. 27, 1987; pp. 256-258; vol. 51(4); American Institute of Physics.
Berger, Michael; Moth Eyes Inspire Self-Cleaning Antireflection Nanotechnology Coatings; 2008; 3 pages; Nanowerk LLC.
Berger, O., Inns, D. and Aberle, A.E. "Commercial White Paint as Back Surface Reflector for Thin-Film Solar Cells", Solar Energy Materials & Solar Cells, vol. 91, pp. 1215-1221,2007.
Bernhard, C.G., "Structural and Functional Adaptation in a Visual System" Endevor vol. 26, pp. 79-84, May 1967.
Betta et al.; Si—PIN X-Ray Detector Technology; Nuclear Instruments and Methods in Physics Research; 1997; pp. 344-348; vol. A, No. 395; Elsevier Science B.V.
Boden, S.A. et al.; Nanoimprinting for Antireflective Moth-Eye Surfaces; 4 pages; 2008.
Bogue: "From bolometers to beetles: the development of the thermal imaging sensors;" sensor Review; 2007; pp. 278-281; Emerald Group Publishing Limited (ISSN 0260-2288).
Borghesi et al.; "Oxygen Precipitation in Silicon," J. Appl. Phys., v. 77(9), pp. 4169-4244 (May 1, 1995).
Born, M. and E.Wolf, "Princip les of Optics, 7th Ed.", Cambridge University Press, 1999, pp. 246-255.
Brieger,S., O.Dubbers, S.Fricker, A.Manzke, C.Pfahler, A.Plettl, and P.Zlemann, "An Approach for the Fabrication of Hexagonally Ordered Arrays of Cylindrical Nanoholes in Crystalline and Amorphous Silicon Based on the Self-Organization of Polymer Micelles", Nanotechnology, vol. 17, pp. 4991-4994, 2006, doi:10.1088/0957-4884/17/19/036.
Buttgen, B.; "Demodulation Pixel Based on Static Drift Fields"; IEEE Transactions on Electron Devices, vol. 53, No. 11, Nov. 2006.
Campbell, Stephen A., "The Science and Engineering of Microeletronic Fabrication, 2nd Ed.", Oxford University Press, 2001, pp. 406-411.
Carey, P.G. et al., "In-situ Doping of Silicon Using Gas Immersion Laser Doping (GILD) Process," Appl. Surf. Sci. 43, 325-332 (1989).
Carey et al., "Femtosecond-Laser-Assisted Microstructuring of Silicon Surfaces", Optics and Photonics News, 2003. 14, 32-36.
Carey, et al. "Femtosecond Laser-Assisted Microstructuring of Silicon for Novel Detector, Sensing and Display Technologies", LEOS 2003, 481-482, Tuscon, AR.
Carey, et al. "Femtosecond Laser-Assisted Microstructuring of Silicon for Novel Detector, Sensing and Display Technologies", LEOS; 2002, 97-98, Glasgos, Scotland, 2002.
Carey, et al., "Fabrication of Micrometer-Sized Conical Field Emitters Using Femtosecond Laser-Assisted Etching of Silicon," Proc. IVMC 2001, 75-76, UC Davis, Davis, CA.
Carey, et al., "Field Emission from Silicon. Microstructures Formed by Femtosecond Laser Assisted Etching," Proc. CLEO 2001 (Baltimore, MD 2001) 555-557.
Carey, et al., "High Sensitivity Silicon-Based VIS/NIR Photodetectors", Optical Society of America (2003) 1-2.
Carey, III; "Femtosecond-laser Microstructuring of Silicon for Novel Optoelectronic Devices"; Harvard University, Jul. 2004; (Thesis).
Chang, S.W., V.P.Chuang, S.T.Boles, and C.V.Thompson, "Metal-Catalyzed Etching of Vertically Aligned Polysilicon and Amorphous Silicon Nanowire Arrays by Etching Direction Confinement", Advanced Functional Materials, vol. 20, No. 24, pp. 4364-4370, 2010.
Chen, Q. et al.; Broadband moth-eye antireflection coatings fabricated by low-cost nanoimprinting; Applied Physics Letters 94; pp. 263118-1-263118-3; 2009; American Institute of Physics.
Chien et al, "Pulse Width Effect in Ultrafast Laser Processing of Materials," Applied Physics A, 2005, 1257-1263, 81, Springer Berlin, Heidelberg, Germany.
Chiang, Wen Jen Et al., "Silicon Nanocrystal-Based Photosensor on Low-Temperature Polycrystalline-Silicone Panels", Applied Physics Letters, 2007, 51120-1-51120-3, Ltt. 91, American Inst. of Physics, Melville, NY.
Chichkov, B.N. et al, "Femtosecond, picosecond and nanosecond laser ablation of solids" Appl. Phys. A 63, 109-115; 1996.

(56) References Cited

OTHER PUBLICATIONS

Cilingiroglu et al., "An evaluation of MOS Interface-Trap Charge Pump as and Ultralow Constant-Current Generator," IEEE Journal of Solid-State Circuit, 2003, vol. 38, No. 1, Jan. 2003, 71-83.

Clapham, P.B. et al, "Reduction of Lens Reflexion by the Moth Eye Principle" Nature, vol. 244. Aug. 1973, pp. 281-282.

Cmosis; "Global Shutter Image Sensors for Machine Vision Application"; Image Sensors Europe 2010, Mar. 23-25, 2010; .COPYRGT. copyright 2010.

Cotter, Jeffrey E.; Optical intensity of light in layers of silicon with rear diffuse reflectors; Journal of Applied Physics; Jul. 1, 1998; pp. 618-624; vol. 84, No. 1; American Institute of Physics.

Crouch et al., "Comparison of Structure and Properties of Femtosecond and Nanosecond Laser-Structured Silicon" Appl. Phys. Lett., 2004, 84,1850-1852.

Crouch et al., "Infrared Absorption by Sulfur-Doped Silicon Formed by Femtosecond Laser Irradiation", Appl. Phys. A, 2004, 79, 1635-1641.

Despeisse, et al.; "Thin Film Silicon Solar Cell on Highly Textured Substrates for High Conversion Efficiency"; 2004.

Detection of X-ray and Gamma-ray Photons Using Silicon Diodes; Dec. 2000; Detection Technology, Inc.; Micropolis, Finland.

Dewan, Rahul et al.; Light Trapping in Thin-Film Silicon Solar Cells with Submicron Surface Texture; Optics Express; vol. 17, No. 25; Dec. 7, 2009; Optical Society of America.

Deych et al.; Advances in Computed Tomography and Digital Mammography; Power Point; Nov. 18, 2008; Analogic Corp.; Peabody, MA.

Dobie, et al.; "Minimization of reflected light in photovoltaic modules"; Mar. 1, 2009.

Dobrzanski, L.A. et al.; Laser Surface Treatment of Multicrystalline Silicon for Enhancing Optical Properties; Journal of Materials Processing Technology; p. 291-296; 2007; Elsevier B.V.

Dolgaev et al., "Formation of Conical Microstructures Upon Laser Evaporation of Solids", Appl. Phys. A, 2001, 73, 177-181.

Duerinckx, et al.; "Optical Path Length Enhancement for >13% Screenprinted Thin Film Silicon Solar Cells"; 2006.

Dulinski, Wojciech et al.; Tests of backside illumincated monolithic CMOS pixel sensor in an HPD set-up; Nuclear Instruments and methods in Physics Research; Apr. 19, 2005; pp. 274-280; Elsevier B.V.

Forbes; "Texturing, reflectivity, diffuse scattering and light trapping in silicon solar cells"; 2012.

Forbes, L. and M.Y. Louie, "Backside Nanoscale Texturing to Improve IR Response of Silicon Photodetectors and Solar Cells," Nanotech, vol. 2, pp. 9-12, Jun. 2010.

Fowlkes et al., "Surface Microstructuring and Long-Range Ordering of Silicon Nanoparticles", Appl. Phys. Lett., 2002, 80 (20), 3799-3801.

Gibbons, J., "Ion Implantation in Semiconductors—Part II; Damage Production and Annealing", proceedings of the IEEE vol. 60, No. 9 pp. 1062-1096. Jun. 1972.

Gjessing, J. et al.; 2D back-side diffraction grating for impored light trapping in thin silicon solar cells; Optics Express; vol. 18, No. 6; pp. 5481-5495; Mar. 15, 2010; Optical Society of America.

Gjessing, J. et al.; 2D blazed grating for light trapping in thin silicon solar cells; 3 pages; 2010; Optical Society of America.

Gloeckler et al. Band-Gap Grading in CU(In,Ga)Se2 Solar Cells, Journal of Physics and Chemistry of Solids; 2005; pp. 189-194; vol. 66.

Goetzberger, et al.; "Solar Energy Materials & Solar Cells"; vol. 92 (2008) pp. 1570-1578.

Han et al., "Evaluation of a Small Negative Transfer Gate Bias on the Performance of 4T CMOS Image Sensor Pixels," 2007 International Image Sensor Workshop, 238-240, Ogunquit, Maine.

Haug, et al.; "Light Trapping effects in thin film silicon solar cells"; 2009.

Her et al., "Microstructuring of Silicon with Femtosecond Laser Pulses," Applied Physics Letters, 1998, 1673-1675, vol. 73, No. 12, American Institute of Physics.

Her et al., "Novel Conical Microstructures Created in Silicon With Femtosecond Laser Pulses", CLEO 1998, 511-512, San Francisco, CA.

Her, et al., "Femtosecond laser-induced formation of spikes on silicon," Applied Physics A, 2000, 70, 383-385.

Hermann, S. et al.; Impact of Surface Topography and Laser Pulse Duration for Laser Ablation of Solar Cell Front Side Passivating SiNx Layers; Journal of Applied Physics; vol. 108, No. 11; pp. 114514-1-114514-8; 2010; American Institute of Physics.

High-Performance Technologies for Advanced Biomedical Applications; .COPYRGT. 2004Brochure; pp. 1-46; PerkinElmerOptoelectronics.

Holland; Fabrication of Detectors and Transistors on High-Resistivity Silicon; Nuclear Instruments and Methods in Physics Research, vol. A275, pp. 537-541 (1989).

Hong et al., "Cryogenic processed metal-semiconductor-metal (MSM) photodetectors on Mbe grown ZnSe,", 1999, IEEE Transactions on Electron Devices, vol. 46, No. 6, pp. 1127-1134.

Hsieh et al., "Focal-Plane-Arrays and Cmos Readout Techniques of Infrared Imaging Systems," IEE Transactions on Circuits and Systems for Video Technology, 1997, vol. 7, No. 4, Aug. 1997, 594-605.

Hu et al., "Solar Cells from Basic to Advanced Systems," McGraw Hill Book Co., 1983, 39, New York, New York.

Huang, et al.; "Microstructured silicon photodetector"; Applied Physics Letters 89, 033506; 2006 American Institute of Physics; 2006.

Huang, et al.; "Key Technique for texturing a uniform pyramid structure with a layer of silicon nitride on monocrystalline silicon wafer" Applied Surface Science; 2013 pp. 245-249.

Hüpkes, J. et al.; Light Scattering and Trapping in Different Thin Film Photovoltaic Devices; 24th European Photovoltaic Solar Energy Conference, Hamburg, Germany (Sep. 21-25, 2009); pp. 2766-2769.

Igalson et al. Defect States in the CIGS Solar cells by Photocapacitance and Deep Level Optical Spectroscopy; Bulletin of the Polish Academy of Sciences Technical Sciences; 2005; pp. 157-161; vol. 53(2).

"Infrared Absorption by Sulfur-Doped Silicon formed by Femtosecond Laser Irradiation"; Springer Berline/Heidelberg, vol. 79, Nov. 2004.

Jansen, H. et al., "The Black Silicon Method: a universal method for determining the parameter setting of a flourine-based reactive ion etcher in deep silicon trench etching with profile control",J. Micromech. Microeng. vol. 5, 1995 pp. 115-120.

Job et al., "Doping of Oxidized Float Zone Silincon by Thermal Donors—A low Thermal Budget Doping Method for Device Applications?" Mat. Res. Soc. Symp. Pro.; v. 719, F9.5.1-F9.5.6 (2002).

Joy, T. et al.; Development of a Production-Ready, Back-Illuminated CMOS Image Sensor with Small Pixels; Electron Devices Meeting; pp. 1007-1010; 2007; IEEE.

Juntunen et al.; Advanced Photodiode Detector for Medical CT Imaging: Design and Performance; 2007; pp. 2730-2735; IEEE.

Kim et al.; "Strong Sub-Band-Gap Infrared Absorption in Silicon Supersaturated with Sulfur"; 2006 Appl. Phys. Lett. 88, 241902-1-241902-3.

Koh et al., "Simple nanostructuring on silicon surfaceby means of focused beam patterning and wet etching", Applied Surface Science, 2000 pp. 599-603.

Kolasinski et al., "Laser Assisted and Wet Chemical Etching of Silicon Nanostructures," J. Vac. Sci. Technol., A 24(4), Jul./Aug. 2006, 1474-1479.

Konstantatos et al., "Engineering the Temproal Response of Photoconductive Photodetectors via Selective Introduction of Surface Trap States," Nano Letters, v. 8(5), pp. 1446-1450 (Apr. 2, 2008).

Konstantatos et al., "PbS Colloidal Quantum Dot Photoconductive Photodetectors: Transport, Traps, and Gain," Appl. Phys. Lett., v. 91, pp. 173505-1-173505-3 (Oct. 23, 2007).

Kray, D. et al.; Laser-doped Silicon Soalr Cells by Laser Chemical Processing (LCP) exceeding 20% Efficiency; 33rd IEEE Photovoltaic Specialist Conference; 3 pages; May 2008; IEEE.

Kroning et al.; X-ray Imaging Systems for NDT and General Applications; 2002; Fraunhofer Institute for Nondestructive Testing; Saarbrucken and Dresden, Germany.

(56) References Cited

OTHER PUBLICATIONS

Kryski; A High Speed 4 Megapixel Digital CMOS Sensor; 2007 International Image Sensor Workshop; Jun. 6-10, 2007.
Li, "Design and Simulation of an Uncooled Double-Cantilever Microbolometer with the Potential for .about.mK NETD," 2004, Sensors and Actuators A, 351-359, vol. 112, Elsevier B.V.
Li et al., "Gettering in High Resistive Float Zone Silicon Wafers," Transaction on Nuclear Science, vol. 36(1), pp. 290-294 (Feb. 1, 1989).
Li, Hongsong et al.; An experimental study of the correlation between surface roughness and light scattering for rough metallic surfaces; Advanced Characterization Techniques for Optics, Semiconductors, and Nanotechnologies II; 2005; pp. 25780V-1-25780V-15; vol. 5878; SPIE Bellingham, WA.
Lin, A. et al.; Optimization of Random Diffraction Gratings in Thin-Film Solar Cells Using Genetic Algorithms; 2007; 1 page; SSEL Annual Report.
Low Dose Technologies; Power Point.
Madzharov, et al.; "Light trapping in thin-firm silicon solar cells for superstrate and substrate configuration" Abstract #1614, 218.sup.th ECS Meeting .COPYRGT. 2010 The Electrochemical Society.
"Masimo Rainbow Set Pulse CO-Oximetry," 2010, Masimo Corporation, Irvine, California, http://www.masimo.com/Rainbow/about.htm.
Mateus; C.F.R. et al.; Ultrabroadband Mirror Using Low-Index Cladded Subwavelength Grating; Photonics Technology Letters; vol. 16, Issue No. 2; pp. 518-520; Feb. 2004; IEEE.
Matsuno, Shigeru et al.; Advanced Technologies for High Efficiency Photovoltaic Systems; Mitsubishi Electric Advance; vol. 122; pp. 17-19; Jun. 2008.
Meynants, et al.; "Backside illuminated global shutter COMOS image sensors"; 2011 International Image Sensor Workshop; Jun. 11, 2011.
Moloney, A.M. et al.; Novel Black Silicon PIN Photodiodes; 8 pages; Jan. 25, 2006; SPIE.
Moon et al. Selective emitter using porous silicon for crystalline silicon solar cells. Solar Energy Materials & Solar Cells, v. 93, pp. 846-850 (2009).
Moses; Nuclear Medical Imaging—Techniques and Challenges; Power Point; Feb. 9, 2005; Lawrence Berkeley National Laboratory Department of Functional Imaging.
Murkin, JM and Arangol, M, "Near Infrared spectroscopy as an index of rain and tissue oxygenation," Bri. J. of Anathesia (BJA/PGA Supplement):13-i13 (2009).
Munday, J.N. et al.; Large Integrated Absorption Enhancement in Plasmonic Solar Cells by Combining Metallic Gratings and Antireflection Coatings; Nano Letters; vol. 11, No. 6; pp. 2195-2201; Oct. 14, 2010; American Chemical Society.
Myers, Richard et al., "Enhancing Near-IR Avalanche Photodiodes Performance by Femtosecond Laser Microstructuring" Harvard Dept. of Physics.
Nauka et al., Intrinsic Gettering in Oxygen-Free Silicon; App. Phys. Lett., vol. 46(7), Apr. 4, 1985.
Nauka et al., "New Intrinsic Gettering Process in Silicon Based on Interactions of Silicon Interstitials," J. App. Phys., vol. 60(2), pp. 615-621, Jul. 15, 1986.
Nayak et al, "Semiconductor Laesr Crystallization of a—Si:H," SPIE Digital Library, 2003, 277-380, vol. 4977, Bellingham, Washington. 2003.
Nayak et al, "Ultrafast-Laser-Assisted Chemical Restructuring of Silicon and Germanium Surfaces," Applied Surface Science, 2007, 6580-6583, vol. 253, Issue 15, Elsevier B.V.
Nayak et al, "Semiconductor Laser Crystallization of a—Si:H on Conducting Tin-Oxide-Coated Glass for Solar Cell and Display Applications," Applied Physics A, 2005, 1077-1080, 80, Springer Berlin, Heidelberg, Germany.
Nayak, B.K. et al.; Ultrafast Laser Textured Silicon Solar Cells; Mater. Res. Soc. Symp. Proc.; vol. 1123; 6 pages; 2009; Materials Research Society.

Nayak, et al.; "Efficient light trapping in silicon solar cells by ultrafast-laser-induced self-assembled micro/nano structures"; Progress in Photovoltaics: Research and Applications; 2011.
Oden, et al.; "Optical and Infrared Detection Using Microcantilevers;" SPIE Digital Library on Oct. 13, 2010; vol. 2744; 10 pages.
Ohring, Milton. "The Materials of Science of Thin Films"; pp. 176-179; Academic Press, 1992.
Pain, Bedabrata; Backside Illumination Technology for SOI-CMOS Image Sensors; 2009 IISW Symposium on Backside Illujination of Solid-State Image Sensors, Bergen Norway; Jun. 25, 2009; pp. 1-23.
Pain, Bedabrata; "A Back-Illuminated Megapixel CMOS Image Sensor"; http://hdl.handle.net/2014/3912; May 1, 2005.
Palm et al. CIGSSe Thin Film PB Modules: From Fundamental Investigators to Advanced Performance and Stability; Thin Solid Films; 2004; pp. 544-551; vol. 451-2.
Payne, D.N.R. et al.; Characterization of Experimental Textured ZnO:Al Films for Thin Film Solar Cell Applications and Comparison with Commercial and Plasmonic Alternatives; Photovoltaic Specialists Conference (PVSC); pp. 1560-1564; 2010; IEEE.
Pedraza et al., "Silicon Microcolumn Arrays Grown by Nanosecond Pulsed-Excimer Laser Irradiation", Appl. Phys. Lett., 1999, 74 (16), 2322-2324, American Institute of Physics.
Pedraza et al., "Surface Nanostructuring of Silicon", Appl. Phys. A, 2003, 77, 277-284.
Rashkeev et al., "Hydrogen passivation and Activation of Oxygen Complexes in Silicon," American Institute of Physics, vol. 78(11), pp. 1571-1573 (Mar. 12, 2001).
Russell, et al.; "Nanosecond Eximer Laser Processing for Novel Microelectronic Fabrication"; Nanosecond Excimer Laser Processing; 6 pages; 1989.
Russell, Ramirez and Kelley, "Nanosecond Excimer Laser Processing for Novel Microelectronic Devices," US Navy, SPAWAR, San Diego, Techical Report, 2003.
Russell, Ramirez, Kelley, "Nanosecond Excimer Laser Processing for Novel Microelectronic Fabrication," SSC Pacific Technical Reports , pp. 228-233, 2003, vol. 4, US Navy.
Sai, H. et al.; Enhancement of Light Trapping in Thin-Film Hydrogenated Microcrystalline Si Solar Cells Using Back Reflectors with Self-Ordered Dimple Pattern; Applied Physics Letters; vol. 93; 2008; American Institute of Physics.
Sanchez et al., "Whiskerlike Structure Growth on Silicon Exposed to ArF Excimer Laser Irradiation", Appl. Phys. Lett., 1996, 69 (5), 620-622.
Sanchez et al., "Dynamics of the Hydrodynamical Growth of Columns on Silicon Exposed to ArF Excimer-Laser Irradiation ", Appl. Phys. A, 66, 83-86 (1998).
Sarnet et al.; "Femtosecond laser for black silicon and photovoltaic cells"; Feb. 21, 2008, Proc. of SPIE; vol. 6881; pp. 1-15.
Senoussaoui, N. et al.; Thin-Film Solar Cells with Periodic Grating Coupler; Thin Solid Films; pp. 397-401; 2003; Elsevier B.V.
Serpenguzel et al., "Temperature Dependence of Photluminescence in Non-Crystalline Silicon", Photonics West (San Jose, CA, 2004) 454-462.
Shen et al., "Formation of Regular Arrays of Silicon Micorspikes by Femotsecond Laser Irradiation Through a Mask", Appl. Phys. Lett., 82, 1715-1717 (2003).
Solar Energy Research Institute, "Basic Photovoltaic Principles and Methods," Van Nostrand Reinhold Co., NY 1984, pp. 45-47 and 138-142.
Solhusvik, J. et al. "A 1280x960 3.75um pixel CMOS imager with Triple Exposure HDR," Proc. of 2009 International Image Sensor Workshop, Bergen, Norway, Jun. 22-28, 2009.
Stone et al.; The X-ray Sensitivity of Amorphous Selenium for Mammography;.Am. Assoc. Phys. Med.; Mar. 2002; pp. 319-324; vol. 29 No. 3; Am. Assoc. Phys. Med.
Szlufcik, J. et al.; Simple Integral Screenprinting process for selective emitter polycrystalline silicon solar cells; Applied Physics Letters; vol. 59, No. 13; Sep. 23, 1991; American Institute of Physics.
Tabbal et al., "Formation of Single Crystal Sulfur Supersaturated Silicon Based Junctions by Pulsed Laser Melting". 2007, J. Vac. Sci. Technol. B25(6), 1847-1852.

(56) References Cited

OTHER PUBLICATIONS

Takayanagi, et al.; "A 600.times.600 Pixel, 500, fps CMOS Image Sensor with a 4.4 jum Pinned Photodiode 5-Transistor Global Shutter Pixel"; 2007 International Image Sensor Workshop; Jun. 6-10, 2007.
Tower, John R. et al.; Large Format Backside Illuminated CCD Imager for Space Surveillance; IEEE Transactions on Electron Devices, vol. 50, No. 1; Jan. 2003; pp. 218-224.
Tull; "Femtosecond Laser Ablation of Silicon: Nanoparticles, Doping and Photovotaics"; Harvard University, Jun. 2007 (Thesis).
Uehara et al., "A High-Sensitive Digital Photosensor Using MOS Interface-Trap Charge Pumping," IEICE Electronics Express, 2004, vol. 1, No. 18, 556-561.
Wilson, "Depth Distributions of Sulfur Implanted Into Silicon as a Function of Ion energy, Ion Fluence, and Anneal Temperature," 1984, Appl. Phys. 55(10, 3490-3494.
Winderbaum, S. et al.; Reactive ion etching (RIE) as a method for texturing polycrystalline silicon solar cells; Solar Energy Materials and Solar Cells; 1997; pp. 239-248; Elsevier Science B.V.
Wu et al., "Black Silicon" Harvard UPS 1999.
Wu et al., "Black Silicon: A New Light Absorber," APS Centennial Meeting (Mar. 23, 1999).
Wu et al., "Femtosecond laser-gas-solid interactions," Thesis presented to the Department of Physics at Harvard University, pp. 1-113, 126-136, Aug. 2000.
Wu et al., "Visible Luminescence From Silicon Surfaces Microstructured in Air". Appl. Phys. Lett., vol. 81, No. 11, 1999-2001 (2002).
Wu, et al "Near-Unity Below-Band-Gap Absorption by Microstructured Silicon," 2001, Applied Physics Letters, 1850-1852, vol. 78, No. 13, American Institute of Physics.
Xu, Y., et al, "Infrared Detection Using Thermally Isolated Diode," Sensors and Actuators A, Elsevier Sequoia S.A., 1993, vol. 36, 209-217, Lausanne, Switzerland.
Yablonovitch, et al.; "Intensity Enhancement in Textured Optical Sheets for Solar Cells"; .COPYRGT. 1982 IEEE.
Yamamoto, K. et al.; NIR Sensitivity Enhancement by Laser Treatment for Si Detectors; Nuclear Instruments and Methods in Physics Research A; pp. 520-523; Mar. 31, 2010; Elsevier.
Yan, B.; Light Trapping Effect from Randomized Textures of Ag/ZnO Back Reflector on Hydrogenated Amorphous and Nanocrystalline Silicon Based Solar Cells; Thin Film Solar Technology II; vol. 7771; 2010; SPIE.
Yasutomi, et al.; "Two-Stage Charge Transfer Pixel Using Pinned Diodes for Low-Noise Global Shutter Imaging"; 2009 International Image Sensor Workshop; Mar. 28, 2009.
Younkin et al., "Infrared Absorption by Conical Silicon Microstructures Made in a Variety of Background Gases Using Femtosecond-Laser Pulses", J. Appl. Phys., 93, 2626-2629 (2003).
Younkin, "Surface Studies and Microstructure Fabrication Using Femtosecond Laser Pulses," Thesis presented to the Division of Engineering & Applied sciences at Harvard University (Aug. 2001).
Yuan, et al.; "Efficient black silicon solar cell with a density-graded nanoporous surface: Optical properties, performance limitations, and design rules"; American Institute of Physics; Applied Physics Letters 95. 1230501 (2009) 3 pages.
Zaidi, S.H. et al.; Diffraction Grating Structures in Solar Cells; Photovoltaic Specialists Conference, 2000; 4 pages; Sep. 2000; IEEE.
Zhang et al, "Ultra-Shallow P+-Junction Formation in Silicon by Excimer Laser Doping: a Heat and Mass Transfer Perspective," Int. J. Heat Mass Transfer, 1996, 3835-3844, vol. 39, No. 18, Elsevier Science Ltd., Great Britain.
Zhong, S. et al. "Excellent Light Trapping in Ultrathin Solar Cells," AFM-Journal, May 2016 pp. 1-11.
Zhu et al., "Evolution of Silicon Surface Microstructures by Picosecond and Femtosecond Laser Irradiations," Applied Surface Science, 2005, 102-108, Elsevie, Amsterdam, NL.Ultra-Shallow P+-Junction Formation in Silicon by Excimer Laser Doping: a Heat and Mass Transfer Perspective, Int. J. Heat Mass Transfer, 1996, 3835-3844, vol. 39, No. 18, Elsevier Science Ltd., Great Britain.
Ziou et al., "Depth from defocus using the hermite transform", Image Processing, 1998. ICIP 98. Intl. Conference on Chicago, IL. Oct. 1998 pp. 958-962.
Aberle, Progress with polycrystalline silicon thin-film solar cells on glass at UNSW. Journal of Crystal Growth 287,386-390 (2006).
Agranov, et al., Pixel continues to shrink . . . Small Pixels for Novel CMOS Image Sensors, 4 pages.
Amoruso et al., Emission of nanoparticles during ultrashort laser irradiation of silicon targets. Europhysics Letters 67, 404-410 (2004).
Arango et al., Charge transfer in photovoltaics consisting of inter-penetrating networks of conjugated polymer and $TiO_2$ nanoparticles. Applied Physics Letters 74, 1698-1700 (1999).
Beek et al., Efficient hybrid solar cells from zinc oxide nanoparticles and a conjugated polymer. Advanced Materials 16, 1009-1013 (2004).
Bentini et al., Surface doping of semiconductors by pulsed-laser irradiation in reactive atmosphere. Applied Physics A: Materials Science & Processing. 1988;45(4):317-324.
Blood et al., Electrical Characterization of Semiconductors. Reports on Progress in Physics 41, 157-257 (1978).
Bouhdata, A. et al. "Modeling of the Spectral Response of PIN Photodetectors Impact of Exposed Zone Thickness, Surface Recombination Velocity and Trap Concentration", Microelectronics Reliability 44, pp. 223-228 (2004);.
Brus, Luminescence of Silicon Materials-Chains, Sheets, Nanoclystals, Nanowires, Microcrystals, and Porous Silicon. Journal of Physical Chemistry 98,3575-3581 (1994).
Bucksbaum et al., Rapid Melting and Regrowth Velocities in Silicon Heated by Ultraviolet Picosecond Laser-Pulses, Physical Review Letters 53, 182-185 (1984).
Bulgakov et al., Silicon clusters produced by femtosecond laser ablation: non-thermal emission and gas-phase condensation. Applied Physics Materials Science & Processing 79, 1591-1594 (2004).
Byung Jun Park et al, Jpn. J. Appl. Phys. 46 2454, 2007, 5 pages.
Campbell et al., Light Trapping Properties of Pyramidally Textured Surfaces. Journal of Applied Physics 62, 243-249 (1987).
Carey et al, "High Sensitivity Silicon-Based VIS/NIR Photodetectors", CLEO 2004 (San Francisco, CA 2004) pp. 1-2.
Carey et al., In-situ doping of silicon using the gas immersion laser doping (GILD) process. Applied Surface Science. vol. 43, Issues 1-4, Dec. 2, 1989, pp. 325-332.
Carey et al., Visible and near-infared responsivity of femtosecondlaser microstrnctured silicon photodiodes. Opt. Lett. 2005;30: 1773-5.
Carey, Femtosecond-laser microstructuring of silicon for novel optoelectronic devices. Thesis. The Division of Engineering and Applied Sciences. Harvard University. Cambridge, MA. Jul. 2004 162 pages.
Choubey et al., On Evolution of CMOS Image Sensors, Proceedings of the 8th International Conference on Sensing Technology, Sep. 2-4, 2014, Liverpool, UK, pages.
Cifre, Polycrystalline Silicon Films Obtained by Hot-Wire Chemical-Vapor-Deposition. Applied Physics aMaterials Science & Processing 59, 645-651 (1994).
Contreras et al., Progress toward 20% efficiency in Cu(In,Ca)Se-2 polycrystalline thin-film solar cells. Progress in Photovoltaics 7, 311-316 (1999).
Cuadra et al., Present status of intermediate band solar cell research. Thin Solid Films 451-52, 593-599 (2004).
Curtins et al., High-Rate Deposition of Amorphous Hydrogenated Silicon-Effect of Plasma Excitation-Frequency. Electronics Letters 23, 228-230 (1987).
Delley et al., Quantum Confinement in Si Nanocrystals. Physical Review B 47, 1397-1400 (1993).
Fontaine, a Review of the 1.4 µm Pixel Generation, Technology Analysis Group Chipworks Inc., 2011, 4 pages.
Fontaine, Ray, A Survey of Enabling Technologies in Successful Consumer Digital Imaging Products (Part 3: Pixel Isolation Structures), http://www.techinsights.com,Jul. 24, 2017, 13 pages.
Glezer et al., Ultrafast-laser driven micro-explosions in transparent materials. Applied Physics Letters 71, 882-884 ( 1997).

(56) References Cited

OTHER PUBLICATIONS

Glover et al., Probing paiticle synthesis during femtosecond laser ablation: initial phase transition kinetics. Applied Physics B Lasers and Optics 78, 995-1000 (2004).
Glover, Hydrodynamics of particle formation following femtosecond laser ablation. Journal of the Optical Society of America B—Optical Physics 20, 125-131 (2003).
Goetzbergeret al., Crystalline Silicon Solar Cells (ed.), Chapter 6, High Efficiency Solar Cells. New York: John Wiley& Sons Ltd, 1994.
Green, Recent developments in photovoltaics. Solar Energy 76, 3-8 (2004).
Greenham et al.,Charge sepai•ation and transport in conjugatedpolymerjsemiconductor-nanocrystal composites studied by photoluminescence quenching and photoconductivity. Physical Review B 54, 17628-17637 (1996).
Halls et al., Efficient Photodiodes from Interpenelsating Polymer Networks. Nature 376, 498-500 (1995).
Hansen, Henri et al. "The Black Silicon Method: A Universal Method for determining the Parameter Setting of a Fluorine-Based Reactive Ion Etcher in Depp Silicon Trench Etching With Profile Control", J. Micromedch. Microeng. 5 (1'995) pp. 115-120.
Heisterkamp et al., Pulse energy dependence of subcellular dissection by femtosecond laser pulses. Optics Express 13, 3690-3696 (2005).
Henry, Limiting Efficiencies of Ideal Single and Multiple Energy Gap Terrestrial Solar-Cells. Journal of Applied Physics 51, 4494-4500 (1980).
http://electroiq.com/insights-from-leading-edge/2016/09/iftle-303-sony-introduces-ziptronix-dbi-technology-in-samsung-galaxy-s7, "Omnivision was the first to sample BSI in 2007 but costs were too high and adoption was thus very low", (2016).
http://joseph-tang.blogspot.com/2017/, Oshiyama et al. , Near-infrared Sensitivity Enhancement of a Back-illuminated Complementary Metal Oxide Semiconductor Image Sensor with a Pyramid Surface for Diffraction Structure,(2017).
https://blogs.yahoo.co.jp/miyabiman_now/25628945.html.
Huang et al., "A uniform 290 nm periodic Square Strcuture on ZnO Fabricated by Two-Beam Femtosecond Laser Ablation," Nanotechnolgoy, 8 pp. 1-6 (2007).
Imec, 3D Integrated Image Sensors for Smart Imaging Systems, Piet De Moor, 2010, 32 pages.
Itonaga et al., "Extremely-low-noise CMOS Image Sensor with high saturation capacity," 2011 International Electron Devices Meeting, Washington, DC, 2011, pp. 8.1.1-8.1.4.
Keppner et al., Passivation Properties of Amorphous and Microcrystalline Silicon Layers Deposited by VHF-GD for Crystalline Silicon Solar-Cells. Solar Energy Materials and Solar Cells 34, 201-209 (1994).
Kitamura et al., "Suppression of crosstalk by using backside deep trench isolation for 1.12μm backside illuminated CMOS image sensor," 2012 International Electron Devices Meeting, San Francisco, CA, 2012, pp. 24.2.1-24.2.4.
Korean Intellectual Property Office (KIPO), CMOS Image Sensor, KIPO, 2004, 29 pages.
Lee et al., SNR Performance Comparison of 1.4um Pixel : FSI, Light-guide, and BSI, 2011, 3 pages.
Luque et al., Increasing the efficiency of ideal solar cells by photon induced transitions at intermediate levels. Physical Review Letters 78, 5014-5017 (1997).
Marti et al., Limiting efficiencies for photovoltaic energy conversion in multigap systems. Solar Energy Materials and Solar Cells 43, 203-222 (1996).
Meier et al., Recent progress in micromorph solar cells. Journal of Non-Crystalline Solids 230, 1250-1256 (1998).
Meier etal., Complete Microclystalline P-1-N. SolarCell-Crystalline or Amorphous Cell Behavior. Applied Physics Letters 65, 860-862 (1994).

Minoglou et al., "Reduction of Electrical Crosstalk in Hybrid Backside Illuminated CMOS Imagers using Deep Trench Isolation," 2008 International Interconnect Technology Conference, Burlingame, CA, USA, 2008, pp. 129-131.
Mo et al., Sulfm point defects in crystalline and amorphous silicon. Physical Review B 70 (2004).
Morneault, K. et al., "ISDN Q.921-User Adaptation Layer," Network Working Group, Request for Comments: 3057, The Internet Society, pp. 1-66, (2001 ).
Morneault, K. et al., "SS7 MTP2-User Adaptation Layer," Network Working Group, Internet Draft, The Internet Engineering Task Force, pp. 1-94, (Feb. 2001).
Munck, Generic building blocks for 3D integration and their application on hybrid CMOS image sensors, Katholieke Universiteit Leuven, Kapeldreef 75—B-3001 Heverlee, Sep. 2008, 328 pages.
Myers et al., Enhancing nearinfrared avalanche photodiode performance by femtosecond laser microstructuring. Applied Optics 45, 8825-8831 (2006).
Nayak et al.; "Femtosecond Laser-Induced Micro-Structuring of Thin a-Si:H Films", Material Research Society Symposium proceeedings; vol. 850; Nov. 28-Dec. 2, 2004; pp. MM1.8.1-MM1.8.5.
Nirmal et al., Lwninescence photophysics in semiconductor nanocrystals. Accounts of Chemical Research 32. 407-414 (1999).
Ong et al., "Framework Architecture for Signaling Transport," Network Working Group, Request for Comments: 2719, The Internet Society, pp. 1-24, (Oct. 1999).
O'Regan et al., A Low-Cost, High-Efficiency Solar-Cell Based on DyeSensitized Colloidal Tio2 Films. Nature 353, 737-740 (1991).
Park et al., "Deep Trench Isolation for Crosstalk Suppression in Active Pixel Sensors with 1.7μm Pixel Pitch", in Japanese Journal of Applied Physics, vol. 46, No. 4B, pp. 2454-5457, 2007.
Pavesi, Optical gain in silicon nanocrystals. Nature 408, 440-444 (2000).
Rao, et al., Monolithic and Fully-Hybrid Backside Illuminated CMOS Imagers for Smart Sensing, IMEC, Kapeldreef 75, B-3001 Leuven, Belgium, 4 pages.
Rath et al., Limited influence of grain boundary defects in hot-wire CVD polysilicon films on solar cell performance. Journal of Non-crystalline Solids 230, 1277-1281 (1998).
Reber et al., Crystalline silicon thin-film solar cellsrecent results at Fraunhofer ISE, Solar Energy 77, 865-875 (2004).
Sarnet et al., Laser doping for microelectronics and microtechnology. Proc.of SPIE vol. 5448 pp. 669-680.
Schaffer et al., Micromachining bulk glass by use offemtosecond laser pulses with nanojoule energy. Optics Letters 26, 93-95(2001).
Schuppler et al., Size, Shape, and Composition of Luminescent Species in Oxidized Si Nanocrystals and H-Passivated Porous Si. Physical Review B 52, 4910-4925 (1995).
Serpenguzel et al., "Temperature Dependence of Photoluminescence in Non-Crystalline Silicon", Photonics West (San Jose, CA, 2004) 454-462.
Seto, Electrical Properties of Polyclystalline Silicon Films. Jomnal of Applied Physics 46, 5247-5254 (1975).
Shah et al., Thin-film silicon solar cell technology. Progress in Photovoltaics 12, 113-142 (2004).
Sheehy et al., Chalcogen doping of silicon via intense femtosecondlaser irradiation. Materials Science and Engineering B-Solid State Materials for Advanced Technology 137, 289-294 (2007).
Sheehy et al., Role of the Background Gas in the Morphology and Optical Properties of Laser-Microstructured Silicon. Chem Mater. 2005; 17(14):3582-6.
Shen et al., "Femtosecond laser-induced formation of submicrometer spikes on silicon in water", Appllied Physics Letter, vol. 85(23 ), p. 5694 (2004).
Shockley et al., Detailed Balance Limit ofEfficiency of p-n Junction Solar Cells. Journal of Applied Physics 32,510-519 (1961).
Sidebottom, G. et al., "SS7 MTP3-User Adaptation Layer (M3UA)," Network Working Group, Internet Draft, The Internet Engineering Task Force, pp. 1-128, (Feb. 2001).
Sipe et al., Laser-Induced Periodic Surface-Structure .1. Theory. Physical Review B 27, 1141-1154 (1983).
Slaoui et al., Advanced inorganic materials for photovoltaics. Mrs Bulletin 32, 211-218 (2007).

(56) References Cited

OTHER PUBLICATIONS

Staebler et al., Stability of N—I—P. Amorphous-Silicon Solar-Cells. Applied Physics Letters 39, 733-735 (1981).
Stalmans et al. Porous silicon in crystalline silicon solar cells: A review and the effect on the internal quantum efficiency. Progress in Photovoltaics 6 233-246 ( 1998).
Stewart, R. et al. "Stream Control Transmission Protocol", Network Working Group, pp. 1-134 (Oct. 2000).
STMicroelctronics, BSI—technical challenges, IISW-2009, Bergen. Jun. 25, 2009, 37 pages.
Stocks et al., Texturing ofpolycrystalline silicon. Solar Energy Materials and Solar Cells 40, 33-42 (1996).
Stupca et al., Enhancement of polycrystalline silicon solar cells using ultrathin films of silicon nanoparticle. Applied Physics Letters 91, 063107 (2007).
Svrcek et al., Ex situ prepared Si nanocrystals embedded in silica glass: Formation and characterization. Journal of Applied Physics 95, 3158-3163 (2004).
Svrcek et al., Silicon nanocrystals as light converter for solar cells. Thin Solid Films 451-52, 384-388 (2004).
Tiwari et al., A silicon nanocrystals based memo1y. Applied Physics Letters 68, 1377-1379 (1996).
Torres et al., Device grade microcrystalline silicon owing to reduced oxygen contamination, Applied Physics Letters 69, 1373-1375 (1996).
Tournier, et al., Pixel-to-Pixel isolation by Deep Trench technology, STMicroelectronics, 850, rue Jean Monnet—F-38926 Crolles Cedex—France, 2011, 4 pages.
Tournier, et al., Pixel-to-Pixel isolation by Deep Trench technology: Application to CMOS Image Sensor, https://www.researchgate.net/publication/268300742, 2011, 5 pages.
Tull et al., Formation of silicon nanoparticles and web-like aggregates by femtosecond laser ablation in a background gas. Applied Physics a—Materials Science & Processing 83, 341-346 (2006).
Tull et al., Silicon surface morphologies after femtosecond laser irradiation, Mrs Bulletin 31, 626-633 (2006).
Van der Zel, L. "SF6 and the Environment," EPRI, Nov. 2003.
Vigue, F. et al. "Visible-blind Ultraviolet Photodetectors based on ZnMgBeSe" Journal of Electronic Materials, vol. 30, No. 6, pp. 4190-4192 (2001).
Wilson et al., Quantum Confinement in Size-Selected, Surface-Oxidized Silicon Nanocrystals. Science 262, 1242-1244 (1993 ).
Wronski, Electronic Properties of Amorphous Silicon in Solar-Cell Operation Ieee Transactions on Electron Devices 24, 351-357 (1977).
Wu et al., "13.9%—efficient CdTe polycrystalline thin-film solar cells with an infrared transmission of ~so%", Progress in Photovoltaics 14, 471-483 (2006).
Xiong , Y., et al, "Depth from focusing and defocusing", Computer Vision and Pattern Recognition, 1993. Proceedings CVPR '93., 1993 IEEE , Los Alamitos, CA, USA.IEEE Comput. Soc, Jun. 15, 1993 (Jun. 15, 1993), pp. 68-73.
Yaung et al., "High performance 300mm backside illumination technology for continuous pixel shrinkage," 2011 International Electron Devices Meeting, Washington, DC, 2011, pp. 8.2.1-8.2.4.
Younkin, R. et al. "Infrared absorption by conical silicon microstrnctures made in a variety of background gases using femtosecond-laserpulses," Proc. CLEO 2001 (Baltimore, MD, 2001) p. 556.
Yu et al., Polymer Photovoltaic CellsEnhanced Efficiencies Via a Network ofInternal Donor-Acceptor Heterojunctions. Science 270, 1789-1791 ( 1995).
Zhao et al., 19.8% efficient "honeycomb" textured multicrystalline and 24.4% monocrystalline silicon solar cells. Applied Physics Letters 73, 1991-1993 (1998).

PROCESS MODULE FOR INCREASING THE RESPONSE OF BACKSIDE ILLUMINATED PHOTOSENSITIVE IMAGERS AND ASSOCIATED METHODS

PRIORITY DATA

The present application claims priority as a continuation application to U.S. patent application Ser. No. 13/493,891 filed on Jun. 11, 2012, which claims priority as a continuation application to U.S. patent application Ser. No. 13/493,891 filed on Jun. 11, 2012, which claims benefit of U.S. Provisional Application Ser. No. 61/495,243, filed on Jun. 9, 2011, which is incorporated herein by reference.

BACKGROUND

The interaction of light with semiconductor materials has been a significant innovation. Silicon imaging devices are used in various technologies, such as digital cameras, optical mice, video cameras, cell phones, and the like. Charge-coupled devices (CCDs) were widely used in digital imaging, and were later improved upon by complementary metal-oxide-semiconductor (CMOS) imagers having improved performance. Many traditional CMOS imagers utilize front side illumination (FSI). In such cases, electromagnetic radiation is incident upon the semiconductor surface containing the CMOS devices and circuits. Backside illumination CMOS imagers have also been used, and in many designs electromagnetic radiation is incident on the semiconductor surface opposite the CMOS devices and circuits. CMOS sensors are typically manufactured from silicon and can covert visible incident light into a photocurrent and ultimately into a digital image. Silicon-based technologies for detecting infrared incident electromagnetic radiation have been problematic, however, because silicon is an indirect bandgap semiconductor having a bandgap of about 1.1 eV. Thus the absorption of electromagnetic radiation having wavelengths of greater than about 1100 nm is, therefore, very low in silicon.

SUMMARY

The present disclosure provides backside-illuminated photosensitive imager devices and associated methods. In one aspect, for example, a backside-illuminated photosensitive imager device can include a semiconductor substrate having multiple doped regions forming a least one junction, a textured region coupled to the semiconductor substrate and positioned to interact with electromagnetic radiation, wherein the textured region includes surface features sized and positioned to facilitate tuning to a preselected wavelength of light, and a dielectric region positioned between the textured region and the at least one junction. The dielectric region is positioned to isolate the at least one junction from the textured region, and the semiconductor substrate and the textured region are positioned such that incoming electromagnetic radiation passes through the semiconductor substrate before contacting the textured region. Additionally, the device includes an electrical transfer element coupled to the semiconductor substrate to transfer an electrical signal from the at least one junction. In some aspects, the dielectric region is positioned to physically isolate the textured region from the at least one junction. In other aspects, the dielectric region is positioned to electrically isolate the textured region from the at least one junction.

In one aspect, the surface features have an average center-to-center distance of one half wavelength of the preselected wavelength of light, multiples of one half wavelength of the preselected wavelength of light, or at least one half wavelength of the preselected wavelength of light, wherein the preselected wavelength in this context is scaled by the refractive index of the surrounding material. In another aspect, the center-to-center distance of the features is substantially uniform across the textured region. In a further aspect, the surface features have an average height of about a multiple of a quarter wavelength of the preselected wavelength of light, wherein the preselected wavelength is scaled by the refractive index of the surrounding material. In another aspect, the surface features can be sized and positioned to reduce specular reflection.

Additional regions and/or structures can be included in various devices according to aspects of the present disclosure. In some aspects, for example, the device can include a reflecting region coupled to the textured region opposite the dielectric region and positioned to reflect electromagnetic radiation passing through the textured region back through the textured region. Various reflective materials can be included in the reflecting region including, without limitation, a Bragg reflector, a metal reflector, a metal reflector over a dielectric material, and the like, including combinations thereof. In some aspects, one or more dielectric layers are positioned between the reflecting region and the textured region. In another aspect, a lens can be optically coupled to the semiconductor substrate and positioned to focus incident electromagnetic radiation into the semiconductor substrate.

The preselected wavelength of light can be any wavelength or wavelength distribution. In one aspect, for example, the preselected wavelength of light can be in the near infrared or infrared range. In another aspect, the preselected wavelength of light can be greater than or equal to about 800 nm.

In another aspect, one or more anti-reflective layers can be deposited on the semiconductor substrate at a surface opposite the at least one junction such that incident light passes through the anti-reflective layer prior to contacting the semiconductor substrate. Additionally, in a further aspect at least one isolation feature can be formed in the semiconductor substrate, where the at least one isolation feature is positioned to reflect light impinging thereon back into the semiconductor substrate.

The present disclosure additionally provides various methods of making a backside-illuminated photosensitive imager device. One such method can include forming at least one junction at a surface of a semiconductor substrate, forming a dielectric region over the at least one junction, and forming a textured region over the dielectric region. The textured region can include surface features sized and positioned to facilitate tuning to a preselected wavelength of light. The dielectric region isolates the at least one junction from the textured region, and the semiconductor substrate and the textured region are positioned such that incoming electromagnetic radiation passes through the semiconductor substrate before contacting the textured region. The method can also include coupling an electrical transfer element to the semiconductor substrate such that the electrical transfer element is operable to transfer an electrical signal from the at least one junction.

Various techniques are contemplated for forming the textured region, and any technique useful for such a process is considered to be within the present scope. Non-limiting examples of such techniques include plasma etching, reactive ion etching, porous silicon etching, lasing, chemical etching, nanoimprinting, material deposition, selective epitaxial growth, lithography, and the like, including combinations thereof. In one specific aspect, the forming of the textured region can include depositing a mask on the dielectric region, etching the dielectric region through the mask to form surface features, and removing the mask from the dielectric region. The surface features can be further etched to round exposed edges. In yet another specific aspect, forming the textured region further includes depositing a first semiconductor material on the dielectric region, texturing the first semiconductor material to form a mask, depositing a second semiconductor material on the mask, and etching the second semiconductor material to form the textured region. In one specific aspect, texturing the second semiconductor material further includes etching the second semiconductor material to form a plurality of scallops pointing toward the semiconductor substrate. A variety of first and second semiconductor materials are contemplated, and any suitable material is considered to be within the present scope. In one aspect, however, the first and second semiconductor materials include silicon, polysilicon, amorphous silicon, or the like, including combinations thereof.

BRIEF DESCRIPTION OF THE DRAWINGS

For a fuller understanding of the nature and advantage of the present invention, reference is being made to the following detailed description of preferred embodiments and in connection with the accompanying drawings, in which.

DETAILED DESCRIPTION

Figure 1:
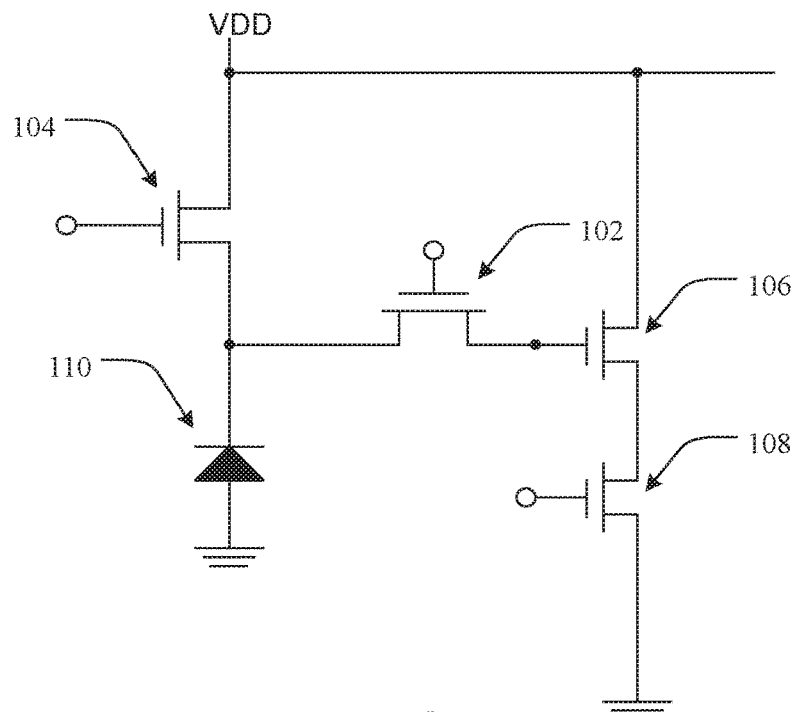
FIG. 1 is a schematic diagram of a four transistor active pixel sensor (APS) of a CMOS imager in accordance with one aspect of the present disclosure.

Before the present disclosure is described herein, it is to be understood that this disclosure is not limited to the particular structures, process steps, or materials disclosed herein, but is extended to equivalents thereof as would be recognized by those ordinarily skilled in the relevant arts. It should also be understood that terminology employed herein is used for the purpose of describing particular embodiments only and is not intended to be limiting.

Definitions

The following terminology will be used in accordance with the definitions set forth below.

It should be noted that, as used in this specification and the appended claims, the singular forms "a," and, "the" include plural referents unless the context clearly dictates otherwise. Thus, for example, reference to "a dopant" includes one or more of such dopants and reference to "the layer" includes reference to one or more of such layers.

As used herein, "tuning" refers to selectively enhancing a device for a property of light at a desired wavelength or range of wavelengths. In one aspect, a property of light can be absorptance, quantum efficiency, polarization, and the like.

As used herein, the term "textured surface" refers to a surface having a topology with nano- to micron-sized surface variations formed by the irradiation of laser pulses or other texturing methods. One non-limiting example of other texturing methods can include chemical etching. While the characteristics of such a surface can be variable depending on the materials and techniques employed, in one aspect such a surface can be several hundred nanometers thick and made up of nanocrystallites (e.g. from about 10 to about 50 nanometers) and nanopores. In another aspect, such a surface can include micron-sized structures (e.g. about 500 nm to about 60 μm). In yet another aspect, the surface can include nano-sized and/or micron-sized structures from about 5 nm and about 500 μm.

As used herein, the terms "surface modifying" and "surface modification" refer to the altering of a surface of a semiconductor material using a variety of surface modification techniques. Non-limiting examples of such techniques include plasma etching, reactive ion etching, porous silicon etching, lasing, chemical etching (e.g. anisotropic etching, isotropic etching), nanoimprinting, material deposition, selective epitaxial growth, and the like, including combinations thereof. In one specific aspect, surface modification can include processes using primarily laser radiation or laser radiation in combination with a dopant, whereby the laser radiation facilitates the incorporation of the dopant into a surface of the semiconductor material. Accordingly, in one aspect surface modification includes doping of a substrate such as a semiconductor material.

As used herein, the term "target region" refers to an area of a substrate that is intended to be doped or surface modified. The target region of the substrate can vary as the surface modifying process progresses. For example, after a first target region is doped or surface modified, a second target region may be selected on the same substrate.

As used herein, the term "fluence" refers to the amount of energy from a single pulse of laser radiation that passes through a unit area. In other words, "fluence" can be described as the energy surface density of one laser pulse.

As used herein, the term "detection" refers to the sensing, absorption, and/or collection of electromagnetic radiation.

As used herein, the term "backside illumination" refers to a device architecture design whereby electromagnetic radiation is incident on a surface of a semiconductor material that is opposite a surface containing the device circuitry. In other words, electromagnetic radiation is incident upon and passes through a semiconductor material prior to contacting the device circuitry.

As used herein, the term "substantially" refers to the complete or nearly complete extent or degree of an action, characteristic, property, state, structure, item, or result. For example, an object that is "substantially" enclosed would mean that the object is either completely enclosed or nearly completely enclosed. The exact allowable degree of deviation from absolute completeness may in some cases depend on the specific context. However, generally speaking the nearness of completion will be so as to have the same overall result as if absolute and total completion were obtained. The use of "substantially" is equally applicable when used in a negative connotation to refer to the complete or near complete lack of an action, characteristic, property, state, structure, item, or result. For example, a composition that is "substantially free of" particles would either completely lack particles, or so nearly completely lack particles that the effect would be the same as if it completely lacked particles. In other words, a composition that is "substantially free of" an ingredient or element may still actually contain such item as long as there is no measurable effect thereof.

As used herein, the term "about" is used to provide flexibility to a numerical range endpoint by providing that a given value may be "a little above" or "a little below" the endpoint.

As used herein, a plurality of items, structural elements, compositional elements, and/or materials may be presented in a common list for convenience. However, these lists should be construed as though each member of the list is individually identified as a separate and unique member. Thus, no individual member of such list should be construed as a de facto equivalent of any other member of the same list solely based on their presentation in a common group without indications to the contrary.

Concentrations, amounts, and other numerical data may be expressed or presented herein in a range format. It is to be understood that such a range format is used merely for convenience and brevity and thus should be interpreted flexibly to include not only the numerical values explicitly recited as the limits of the range, but also to include all the individual numerical values or sub-ranges encompassed within that range as if each numerical value and sub-range is explicitly recited. As an illustration, a numerical range of "about 1 to about 5" should be interpreted to include not only the explicitly recited values of about 1 to about 5, but also include individual values and sub-ranges within the indicated range. Thus, included in this numerical range are individual values such as 2, 3, and 4 and sub-ranges such as from 1-3, from 2-4, and from 3-5, etc., as well as 1, 2, 3, 4, and 5, individually.

This same principle applies to ranges reciting only one numerical value as a minimum or a maximum. Furthermore, such an interpretation should apply regardless of the breadth of the range or the characteristics being described.

The Disclosure

Electromagnetic radiation can be present across a broad wavelength range, including visible range wavelengths (approximately 350 nm to 800 nm) and non-visible wavelengths (longer than about 800 nm or shorter than 350 nm). The infrared spectrum is often described as including a near infrared portion of the spectrum including wavelengths of approximately 800 nm to 1300 nm, a short wave infrared portion of the spectrum including wavelengths of approximately 1300 nm to 3 micrometers, and a mid to long wave infrared (or thermal infrared) portion of the spectrum including wavelengths greater than about 3 micrometers up to about 30 micrometers. These are generally and collectively referred to herein as "infrared" portions of the electromagnetic spectrum unless otherwise noted.

Traditional silicon photodetecting imagers have limited light absorption/detection properties. For example, such silicon based detectors are mostly transparent to infrared light. While other mostly opaque materials (e.g. InGaAs) can be used to detect infrared electromagnetic radiation having wavelengths greater than about 1000 nm, silicon is still commonly used because it is relatively cheap to manufacture and can be used to detect wavelengths in the visible spectrum (i.e. visible light, 350 nm-800 nm). Traditional silicon materials require substantial path lengths to detect photons having wavelengths longer than approximately 700 nm. While visible light can be absorbed at relatively shallow depths in silicon, absorptance of longer wavelengths (e.g. 900 nm) in silicon of a standard wafer depth (e.g. approximately 750 µm) is poor if at all.

The devices of the present disclosure increase the absorptance of semiconductor materials by increasing the propagation path length for longer wavelengths as compared to traditional materials. The absorption depth in conventional silicon detectors is the depth into silicon at which the radiation intensity is reduced to about 36% of the value at the surface of the semiconductor. The increased propagation path length results in an apparent reduction in the absorption depth, or a reduced apparent or effective absorption depth. For example, the effective absorption depth of silicon can be reduced such that these longer wavelengths can be absorbed in material thicknesses of less than or equal to about 850 µm. In other words, by increasing the propagation path length, these devices are able to absorb longer wavelengths (e.g. >1000 nm for silicon) within a thinner semiconductor material. In addition to decreasing the effective absorption depth, the response rate or response speed can also be increased by using thinner semiconductor materials.

Accordingly, backside-illuminated (BSI) photosensitive imager devices and associated methods are provided. Such devices provide, among other things, enhanced response in the infrared light portion of the electromagnetic spectrum and improved response and quantum efficiency in converting electromagnetic radiation to electrical signals. Quantum efficiency can be defined as the percentage of photons that are converted into electrons and collected by a sensing circuit. There are two types of QE, Internal QE (IQE) and External QE (EQE). The EQE is always lower than the IQE since there will inevitably be recombination effects and optical losses (e.g. transmission and reflection losses). One reason for improved performance with BSI is a higher fill factor or, in other words, the percentage if incident light that is incident on a photosensitive region of the device. The various metal layers on top of a front side-illuminated sensor (FSI) limit the amount of light that can be collected in a pixel. As pixel sizes get smaller, the fill factor gets worse. BSI provides a more direct path for light to travel into the pixel, thus avoiding light blockage by the metal interconnect and dielectric layers on the top-side of the semiconductor substrate.

The present disclosure additionally provides BSI broadband photosensitive diodes, pixels, and imagers capable of detecting visible as well as infrared electromagnetic radiation, including associated methods of making such devices. A photosensitive diode can include a semiconductor substrate having multiple doped regions forming at least one junction, a textured region coupled to the semiconductor substrate and positioned to interact with electromagnetic radiation where the textured region includes surface features sized and positioned to facilitate tuning to a preselected wavelength of light, and a dielectric region positioned between the textured region and the at least one junction. The dielectric region is positioned to isolate the at least one junction from the textured region, and the semiconductor substrate and the textured region are positioned such that incoming electromagnetic radiation passes through the semiconductor substrate before contacting the textured region. It should be noted that, in some aspects, the dielectric region can be a passivation region.

In one aspect the multiple doped regions can include at least one cathode region and at least one anode region. In some aspects, doped regions can include an n-type dopant and/or a p-type dopant as is discussed below, thereby creating a p-n junction. In other aspects, a photosensitive device can include an i-type region to form a p-i-n junction.

A photosensitive pixel can include a semiconductor substrate having multiple doped regions forming at least one junction, a textured region coupled to the semiconductor substrate and positioned to interact with electromagnetic radiation where the textured region includes surface features sized and positioned to facilitate tuning to a preselected wavelength of light, and a dielectric region positioned between the textured region and the at least one junction. The dielectric region is positioned to isolate the at least one junction from the textured region, and the semiconductor substrate and the textured region are positioned such that incoming electromagnetic radiation passes through the semiconductor substrate before contacting the textured region. Additionally, the photosensitive pixel also includes an electrical transfer element coupled to the semiconductor substrate and operable to transfer an electrical signal from the at least one junction. A photosensitive imager can include multiple photosensitive pixels. Additionally, an electrical transfer element can include a variety of devices, including without limitation, transistors, sensing nodes, transfer gates, transfer electrodes, and the like.

Photosensitive or photo detecting imagers include photodiodes or pixels that are capable of absorbing electromagnetic radiation within a given wavelength range. Such imagers can be passive pixel sensors (PPS), active pixel sensors (APS), digital pixel sensor imagers (DPS), or the like, with one difference being the image sensor read out architecture. For example, a semiconducting photosensitive imager can be a three or four transistor active pixel sensor (3T APS or 4T APS). Various additional components are also contemplated, and would necessarily vary depending on the particular configuration and intended results. As an example, a 4T configuration as is shown in FIG. 1 can additionally include, among other things, a transfer gate 102, a reset transistor 104, a source follower 106, a row select transistor 108, and a photodiode sensor 110. Additionally, devices having greater than 4 transistors are also within the present scope. In one aspect, photosensor diode 110 can be a conventional pinned photodiode as used in current state of the art complimentary metal-oxide-semiconductor (CMOS) imagers.

Photosensitive imagers can be front side illumination (FSI) or back side illumination (BSI) devices. In a typical FSI imager, incident light enters the semiconductor device by first passing by transistors and metal circuitry. The light, however, can scatter off of the transistors and circuitry prior to entering the light sensing portion of the imager, thus causing optical loss and noise. A lens can be disposed on the topside of a FSI pixel to direct and focus the incident light to the light sensing active region of the device, thus partially avoiding the circuitry. In one aspect the lens can be a micro-lens. In one aspect, for example, incident light enters the device via the light sensing portion and is mostly absorbed prior to reaching the circuitry. BSI designs allow for smaller pixel architecture and a higher fill factor for the imager. It should also be understood that devices according to aspects of the present disclosure can be incorporated into CMOS imager architectures, charge-coupled device (CCD) imager architectures, and the like.

Figure 2:
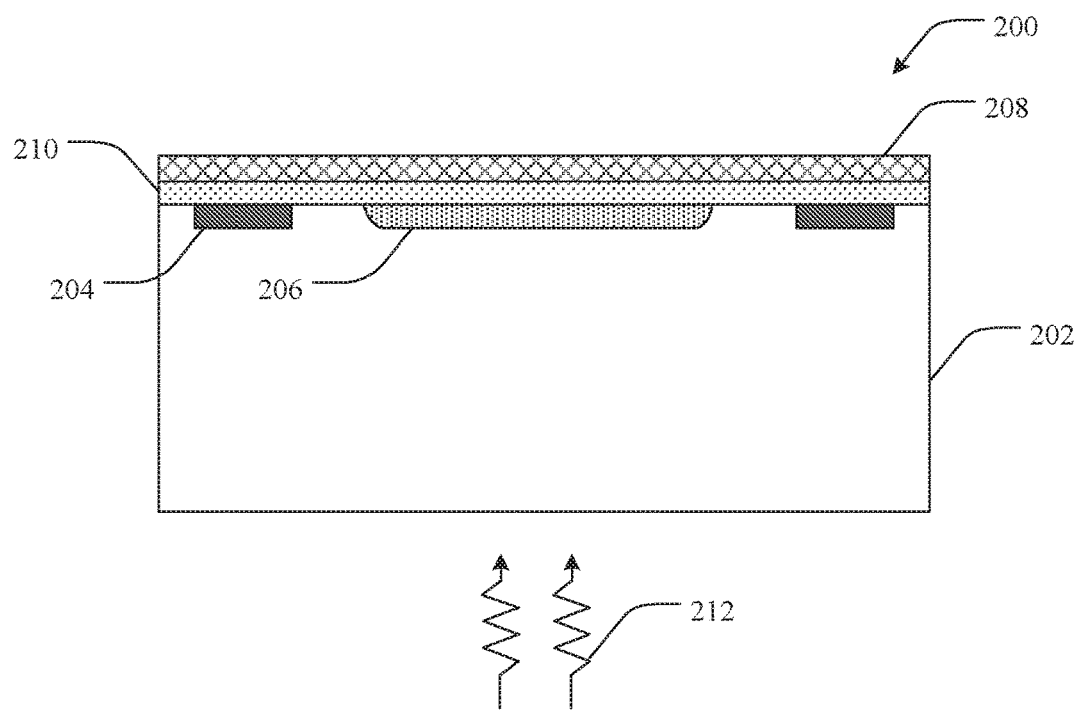
FIG. 2 is a schematic view of a photosensitive device in accordance with another aspect of the present disclosure.

In one aspect, as is shown in FIG. 2, a BSI photosensitive diode 200 can include a semiconductor substrate 202 having multiple doped regions 204, 206 forming at least one junction, and a textured region 208 coupled to the semiconductor substrate 202 and positioned to interact with electromagnetic radiation 212. The multiple doped regions 204, 206 can have the same doping profile or different doping profiles, depending on the device. While the device shown in FIG. 2 contains three doped regions, it should be noted that other aspects containing one or more doped regions are considered to be within the present scope. Additionally, the semiconductor substrate 202 can be doped, and thus can be considered to be a doped region in some aspects. A dielectric region 210 is positioned between the textured region 208 and the at least one junction. In one aspect, the dielectric region can have a thickness in the range of about 1 nm to about 2 µm. In another aspect, the dielectric region can have a thickness in the range of about 10 nm to about 100 nm. In yet another aspect the dielectric region can have a thickness of less than about 50 nm. The dielectric region 210 can be positioned to isolate the at least one junction from the textured region 208, and the semiconductor substrate 202 and the textured region 208 can be positioned such that incoming electromagnetic radiation 212 passes through the semiconductor substrate 202 before contacting the textured region 208. The photosensitive diode is backside illuminated by electromagnetic radiation 212 that is incident on the side of the semiconductor substrate 202 opposite the multiple doped regions 204, 206.

Figure 3:
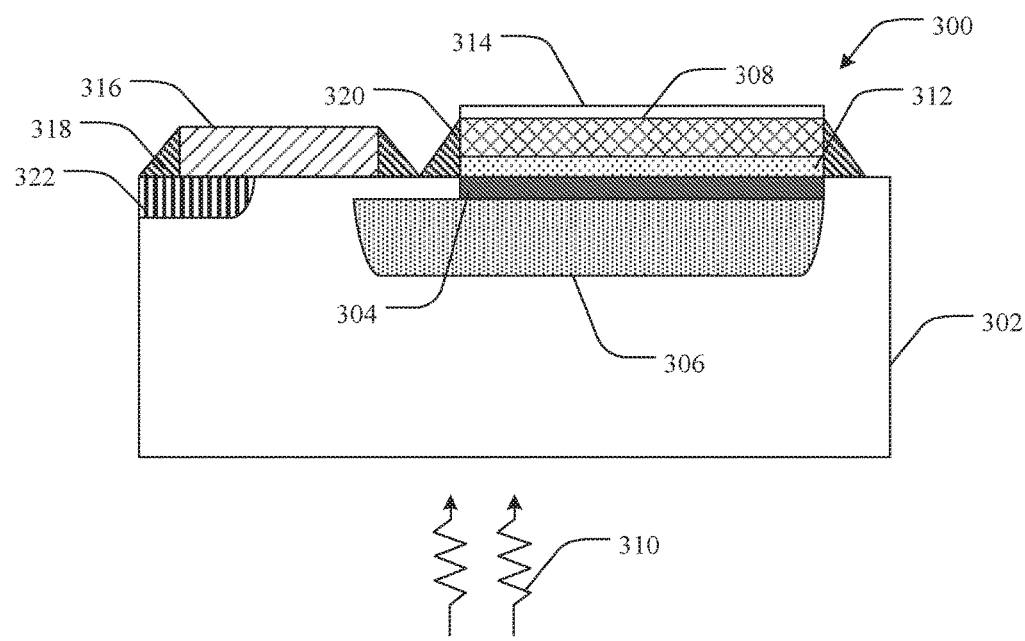
FIG. 3 is a schematic view of a pixel of a photosensitive device with a BSI photodiode in accordance with yet another aspect of the present disclosure.

In another aspect, as is shown in FIG. 3, a BSI photosensitive imager device 300 is provided. The BSI photosensitive imager device can include a semiconductor substrate 302 having multiple doped regions 304, 306 forming a least one junction, and a textured region 308 coupled to the semiconductor substrate 302 and positioned to interact with electromagnetic radiation 310. A dielectric region 312 can be positioned between the textured region 308 and the at least one junction to isolate the at least one junction from the textured region. The semiconductor substrate 302 and the textured region 308 are positioned such that incoming electromagnetic radiation 310 passes through the semiconductor substrate 302 before contacting the textured region 308. Additionally, in some aspects an optional dielectric region or reflecting region 314 can be coupled to the textured region 308. An electrical transfer element 316 can be coupled to the semiconductor substrate 302 to transfer an electrical signal from the at least one junction. Side wall insulators 318 and 320 can also be formed about the transfer element 316 and also around the dielectric and textured regions 312, 314, respectively, to facilitate proper spacing away from the transfer element 316. Additionally, a drain junction region 322 can be electrically coupled to the transfer element 316 to receive charge transferred thereto by the transfer element.

The various devices according to aspects of the present disclosure can exhibit increased quantum efficiency over traditional photosensitive devices. Any increase in the quantum efficiency makes a large difference in the signal to noise ratio. More complex structures can provide not only increased quantum efficiency but also good uniformity from pixel to pixel. In addition, devices of the present disclosure exhibit increased responsivity as compared to traditional photosensitive devices. For example, in one aspect the responsivity can be greater than or equal to 0.8 A/W for wavelengths greater than 1000 nm for semiconductor substrate that is less than 100 μm thick. In other embodiment the responsivity can be greater than 0.5 A/W for wavelengths greater than 1100 nm for semiconductor substrate that is less than 50 μm thick.

A variety of semiconductor materials are contemplated for use with the devices and methods according to aspects of the present disclosure. Non-limiting examples of such semiconductor materials can include group IV materials, compounds and alloys comprised of materials from groups II and VI, compounds and alloys comprised of materials from groups III and V, and combinations thereof. More specifically, exemplary group IV materials can include silicon, carbon (e.g. diamond), germanium, and combinations thereof. Various exemplary combinations of group IV materials can include silicon carbide (SiC) and silicon germanium (SiGe). In one specific aspect, the semiconductor material can be or include silicon. Exemplary silicon materials can include amorphous silicon (a-Si), microcrystalline silicon, multicrystalline silicon, and monocrystalline silicon, as well as other crystal types. In another aspect, the semiconductor material can include at least one of silicon, carbon, germanium, aluminum nitride, gallium nitride, indium gallium arsenide, aluminum gallium arsenide, and combinations thereof.

Exemplary combinations of group II-VI materials can include cadmium selenide (CdSe), cadmium sulfide (CdS), cadmium telluride (CdTe), zinc oxide (ZnO), zinc selenide (ZnSe), zinc sulfide (ZnS), zinc telluride (ZnTe), cadmium zinc telluride (CdZnTe, CZT), mercury cadmium telluride (HgCdTe), mercury zinc telluride (HgZnTe), mercury zinc selenide (HgZnSe), and combinations thereof.

Exemplary combinations of group III-V materials can include aluminum antimonide (AlSb), aluminum arsenide (AlAs), aluminum nitride (AlN), aluminum phosphide (AlP), boron nitride (BN), boron phosphide (BP), boron arsenide (BAs), gallium antimonide (GaSb), gallium arsenide (GaAs), gallium nitride (GaN), gallium phosphide (GaP), indium antimonide (InSb), indium arsenide (InAs), indium nitride (InN), indium phosphide (InP), aluminum gallium arsenide (AlGaAs, $Al_xGa_{1-x}As$), indium gallium arsenide (InGaAs, $In_xGa_{1-x}As$), indium gallium phosphide (InGaP), aluminum indium arsenide (AlInAs), aluminum indium antimonide (AlInSb), gallium arsenide nitride (GaAsN), gallium arsenide phosphide (GaAsP), aluminum gallium nitride (AlGaN), aluminum gallium phosphide (AlGaP), indium gallium nitride (InGaN), indium arsenide antimonide (InAsSb), indium gallium antimonide (InGaSb), aluminum gallium indium phosphide (AlGaInP), aluminum gallium arsenide phosphide (AlGaAsP), indium gallium arsenide phosphide (InGaAsP), aluminum indium arsenide phosphide (AlInAsP), aluminum gallium arsenide nitride (AlGaAsN), indium gallium arsenide nitride (InGaAsN), indium aluminum arsenide nitride (InAlAsN), gallium arsenide antimonide nitride (GaAsSbN), gallium indium nitride arsenide antimonide (GaInNAsSb), gallium indium arsenide antimonide phosphide (GaInAsSbP), and combinations thereof.

The semiconductor substrate can be of any thickness that allows electromagnetic radiation detection and conversion functionality, and thus any such thickness of semiconductor material is considered to be within the present scope. In some aspects, the textured region increases the efficiency of the device such that the semiconductor substrate can be thinner than has previously been possible. Decreasing the thickness of the semiconductor substrate reduces the amount of semiconductor material required to make such a device. In one aspect, for example, the semiconductor substrate has a thickness of from about 500 nm to about 50 μm. In another aspect, the semiconductor substrate has a thickness of less than or equal to about 100 μm. In yet another aspect, the semiconductor substrate has a thickness of from about 1 μm to about 10 μm. In a further aspect, the semiconductor substrate can have a thickness of from about 5 μm to about 50 μm. In yet a further aspect, the semiconductor substrate can have a thickness of from about 5 μm to about 10 μm.

Additionally, various types of semiconductor materials are contemplated, and any such material that can be incorporated into an electromagnetic radiation detection device is considered to be within the present scope. In one aspect, for example, the semiconductor material is monocrystalline. In another aspect, the semiconductor material is multicrystalline. In yet another aspect, the semiconductor material is microcrystalline. It is also contemplated that the semiconductor material can be amorphous. Specific nonlimiting examples include amorphous silicon or amorphous selenium.

The semiconductor materials of the present disclosure can also be made using a variety of manufacturing processes. In some cases the manufacturing procedures can affect the efficiency of the device, and may be taken into account in achieving a desired result. Exemplary manufacturing processes can include Czochralski (Cz) processes, magnetic Czochralski (mCz) processes, Float Zone (FZ) processes, epitaxial growth or deposition processes, and the like. It is contemplated that the semiconductor materials used in the present invention can be a combination of monocrystalline material with epitaxially grown layers formed thereon.

A variety of dopant materials are contemplated for the formation of the multiple doped regions, and any such dopant that can be used in such processes to surface modify a material is considered to be within the present scope. It should be noted that the particular dopant utilized can vary depending on the material being doped, as well as the intended use of the resulting material. For example, the selection of potential dopants may differ depending on whether or not tuning of the photosensitive device is desired.

A dopant can be either charge donating or accepting dopant species. More specifically, an electron donating or a hole donating species can cause a region to become more positive or negative in polarity as compared to the semiconductor substrate. In one aspect, for example, the doped region can be p-doped. In another aspect the doped region can be n-doped. A highly doped region can also be formed on or near the doped region to create a pinned diode. In one non-limiting example, the semiconductor substrate can be negative in polarity, and a doped region and a highly doped region can be doped with p+ and n dopants respectively. In some aspects, variations of n(--), n(-), n(+), n(++), p(--), p(-), p(+), or p(++) type doping of the regions can be used.

In one aspect, non-limiting examples of dopant materials can include S, F, B, P, N, As, Se, Te, Ge, Ar, Ga, In, Sb, and combinations thereof. It should be noted that the scope of dopant materials should include, not only the dopant materials themselves, but also materials in forms that deliver such dopants (i.e. dopant carriers). For example, S dopant materials includes not only S, but also any material capable being used to dope S into the target region, such as, for example, $H_2S$, $SF_6$, $SO_2$, and the like, including combinations thereof. In one specific aspect, the dopant can be S. Sulfur can be present at an ion dosage level of between about $5 \times 10^{14}$ ions/cm$^2$ and about $1 \times 10^{16}$ ions/cm$^2$. Non-limiting examples of fluorine-containing compounds can include $ClF_3$, $PF_5$, $F_2$ $SF_6$, $BF_3$, $GeF_4$, $WF_6$, $SiF_4$, HF, $CF_4$, $CHF_3$, $CH_2F_2$, $CH_3F$, $C_2F_6$, $C_2HF_5$, $C_3F_8$, $C_4F_8$, $NF_3$, and the like, including combinations thereof. Non-limiting examples of boron-containing compounds can include $B(CH_3)_3$, $BF_3$, $BCl_3$, BN, $C_2B_{10}H_{12}$, borosilica, $B_2H_6$, and the like, including combinations thereof. Non-limiting examples of phosphorous-containing compounds can include $PF_5$, $PH_3$, and the like, including combinations thereof. Non-limiting examples of chlorine-containing compounds can include $Cl_2$, $SiH_2Cl_2$, HCl, $SiCl_4$, and the like, including combinations thereof. Dopants can also include arsenic-containing compounds such as $AsH_3$ and the like, as well as antimony-containing compounds. Additionally, dopant materials can include mixtures or combinations across dopant groups, i.e. a sulfur-containing compound mixed with a chlorine-containing compound. In one aspect, the dopant material can have a density that is greater than air. In one specific aspect, the dopant material can include Se, $H_2S$, $SF_6$, or mixtures thereof. In yet another specific aspect, the dopant can be $SF_6$ and can have a predetermined concentration range of about $5.0 \times 10^{-8}$ mol/cm$^3$ to about $5.0 \times 10^{-4}$ mol/cm$^3$. As one non-limiting example, $SF_6$ gas is a good carrier for the incorporation of sulfur into the semiconductor material via a laser process without significant adverse effects on the material. Additionally, it is noted that dopants can also be liquid solutions of n-type or p-type dopant materials dissolved in a solution such as water, alcohol, or an acid or basic solution. Dopants can also be solid materials applied as a powder or as a suspension dried onto the wafer.

As a further processing note, the semiconductor substrate can be annealed for a variety of reasons, including dopant activation, semiconductor damage repair, and the like. The semiconductor substrate can be annealed prior to texturing, following texturing, during texturing, or any combination thereof. Annealing can enhance the semiconductive properties of the device, including increasing the photoresponse properties of the semiconductor materials by reducing any imperfections in the material. Additionally, annealing can reduce damage that may occur during the texturing process. Although any known anneal can be beneficial and would be considered to be within the present scope, annealing at lower temperatures can be particularly useful. Such a "low temperature" anneal can greatly enhance the external quantum efficiency of devices utilizing such materials. In one aspect, for example, the semiconductor substrate can be annealed to a temperature of from about 300° C. to about 1100° C. In another aspect, the semiconductor substrate can be annealed to a temperature of from about 500° C. to about 900° C. In yet another aspect, the semiconductor substrate can be annealed to a temperature of from about 700° C. to about 800° C. In a further aspect, the semiconductor substrate can be annealed to a temperature that is less than or equal to about 850° C.

The duration of the annealing procedure can vary according to the specific type of anneal being performed, as well as according to the materials being used. For example, rapid annealing processes can be used, and as such, the duration of the anneal may be shorter as compared to other techniques. Various rapid thermal anneal techniques are known, all of which should be considered to be within the present scope. In one aspect, the semiconductor substrate can be annealed by a rapid annealing process for a duration of greater than or equal to about 1 µs. In another aspect, the duration of the rapid annealing process can be from about 1 µs to about 1 ms. As another example, a baking or furnace anneal process can be used having durations that may be longer compared to a rapid anneal. In one aspect, for example, the semiconductor substrate can be annealed by a baking anneal process for a duration of greater than or equal to about 1 ms to several hours.

Various types of dielectric region configurations are contemplated, and any configuration that can be incorporated into a photosensitive device is considered to be within the present scope. One benefit to such a dielectric region pertains to the isolation provided between the textured region and the doped regions that form the junction. In one aspect, for example, the dielectric region can be positioned to physically isolate the textured region from the junction. In this way, the creation of the textured region can be isolated from the doped regions, thus precluding undesirable effects of the texturing process from affecting the junction. In another aspect, the dielectric region can be a dielectric material, and thus the dielectric region could be used to electrically isolate the textured region from the junction. In some cases, the dielectric region is coupled directly to at least one of the doped regions forming the junction.

The dielectric region can be made from a variety of materials, and such materials can vary depending on the device design and desired characteristics. Non-limiting examples of such materials can include oxides, nitrides, oxynitrides, and the like, including combinations thereof. In one specific aspect, the dielectric region includes an oxide. Additionally, the dielectric region can be of various thicknesses. In one aspect, for example, the dielectric region has a thickness of from about 100 nm to about 1 micron. In another aspect, the dielectric region has a thickness of from about 5 nm to about 100 nm. In yet another aspect, the dielectric region has a thickness of from about 20 nm to about 50 nm. It should be noted that, in cases where the textured region is a portion of the dielectric region (e.g. a dielectric layer) that has been textured, the thickness of the dielectric material would be increased to account for the texturing. Thus the thickness ranges for the dielectric region provided here would be measured as the thickness of the dielectric region not including the textured portion.

The textured region can function to diffuse electromagnetic radiation, to redirect electromagnetic radiation, to absorb electromagnetic radiation, and the like, thus increasing the quantum efficiency of the device. In the present BSI devices, electromagnetic radiation passing through the semiconductor substrate can contact the textured region. The textured region can include surface features to thus increase the effective absorption length of the photosensitive pixel. Such surface features can be micron-sized and/or nano-sized, and can be any shape or configurations. Non-limiting examples of such shapes and configurations include cones, pillars, pyramids, micolenses, quantum dots, inverted features, gratings, protrusions, scallops, and the like, including combinations thereof. Additionally, factors such as manipulating the feature sizes, dimensions, material type, dopant profiles, texture location, etc. can allow the diffusing region to be tunable for a specific wavelength. In one aspect, tuning the device can allow specific wavelengths or ranges of wavelengths to be absorbed. In another aspect, tuning the device can allow specific wavelengths or ranges of wavelengths to be reduced or eliminated via filtering.

Tuning can also be accomplished through the relative location of the texture region within the device, modifying the dopant profile(s) of regions within the device, dopant selection, and the like. Additionally, material composition near the textured region can create a wavelength specific photosensing pixel device. It should be noted that a wavelength specific photosensing pixel can differ from one pixel to the next, and can be incorporated into an imaging array. For example a 4×4 array can include a blue pixel, a green pixel, a red pixel, and infrared light absorbing pixel, or a blue pixel, two green pixels, and a red pixel.

The textured regions can also be made to be selective to polarized light and light of particular polarizations. In one specific example, if the textured region includes a one dimensional grating of grooves on a high index of refraction material then the scattering of the light will depend upon the polarization of the light and the pixels can select light of specific linear polarizations.

Textured regions according to aspects of the present disclosure can allow a photosensitive device to experience multiple passes of incident electromagnetic radiation within the device, particularly at longer wavelengths (i.e. infrared). Such internal reflection increases the effective absorption length to be greater than the thickness of the semiconductor substrate. This increase in absorption length increases the quantum efficiency of the device, leading to an improved signal to noise ratio.

The materials used for producing the textured region can vary depending on the design and the desired characteristics of the device. As such, any material that can be utilized in the construction of a textured region is considered to be within the present scope. Non-limiting examples of such materials include semiconductor materials, dielectric materials, conductive materials (e.g. metals), silicon, polysilicon, amorphous silicon, transparent conductive oxides, and the like, including composites and combinations thereof. In one specific aspect, the textured layer can be a textured polysilicon layer. Thus a polysilicon layer can be deposited onto the dielectric region and then textured to form the textured region. In another aspect, the textured layer can be a textured dielectric layer. In this case the textured region can be a portion of the dielectric layer making up the dielectric region. In yet another aspect the textured layer can be a transparent conductive oxide or another semiconductor material. In the case of dielectric layers, the textured region can be a textured portion of the dielectric region or the textured region can be formed from other dielectric material deposited over the dielectric region. In the case of semiconductor materials, forming the textured region can include depositing a semiconductor material on the dielectric region and texturing the semiconductor material to form the textured region. In another aspect, the semiconductor material can be bonded or adhered to the dielectric region. The texturing process can texture the entire semiconductor material or only a portion of the semiconductor material. In one specific aspect, a polysilicon layer can be deposited over the dielectric region and textured and patterned by an appropriate technique (e.g. a porous silicon etch) to form the textured region. In yet another aspect, a polysilicon layer can be deposited over the dielectric region and textured and patterned by using a mask, photolithography, and an etch to define a specific structure or pattern.

In addition to surface features, the textured region can have a surface morphology that is designed to focus or otherwise direct electromagnetic radiation, thus enhancing the quantum efficiency of the device. For example, in one aspect the textured region has a surface morphology operable to direct electromagnetic radiation into the semiconductor substrate. Non-limiting examples of various surface morphologies include sloping, pyramidal, inverted pyramidal, spherical, square, rectangular, parabolic, ellipsoidal, asymmetric, symmetric, scallops, gratings, pillars, cones, microlenses, quantum dots, and the like, including combinations thereof.

Figure 4:
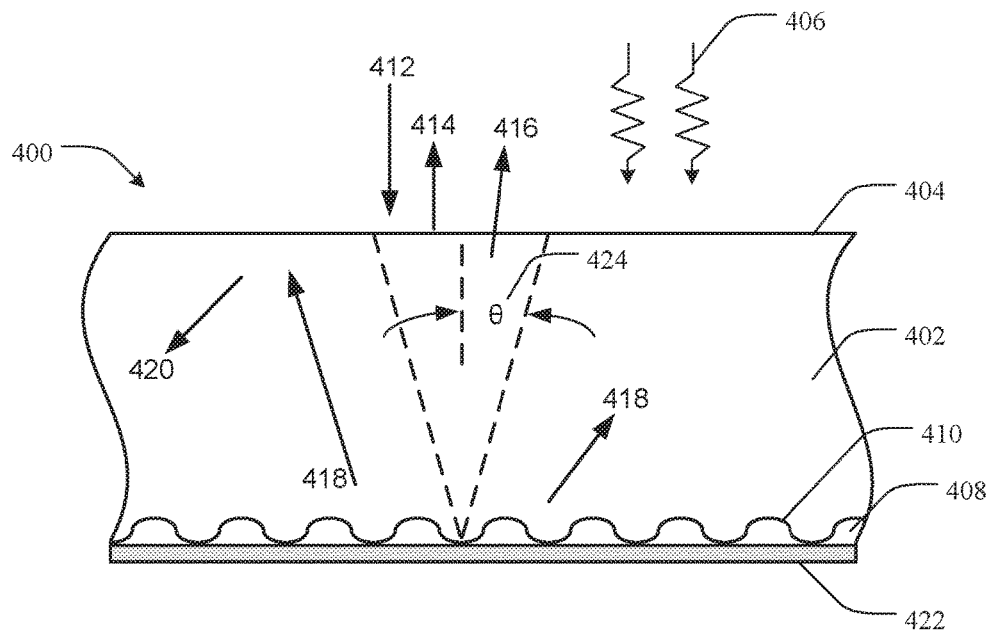
FIG. 4 illustrates light trapping in a thin semiconductor layer with a planar illuminated side and a textured opposing side in accordance with a further aspect of the present disclosure.

One example of such a surface morphology is shown in FIG. 4. Without intending to be limited to any operational theory, the following description provides one possible explanation for the effects of surface morphology in tuning a textured region for specific wavelengths of electromagnetic radiation. FIG. 4 shows a textured device 400 having a surface morphology that affects the near infrared wavelength response. A semiconductor substrate 402 is shown having an illuminated surface 404 to receive incident electromagnetic radiation 406. The semiconductor substrate 402 further has a textured region 408 (e.g. dielectric) coupled thereto at a surface that is opposite to the illuminated surface 404. The textured region 408 has a surface morphology configured in an undulating pattern 410 with grooves, ridges, or similar patterns to produce an internal reflection that is not specular. In the near infrared, the index of refraction of silicon is about η=3.42 and the reflectance is about R=30% from a single planar surface, and transmittance through a single planar surface is T=70% for normally incident waves. The absorption coefficient of silicon is very low in the near infrared. Electromagnetic radiation under normal incidence, represented by arrow 412, is reflected from the illuminated surface 404, and this is shown as arrow 414. There are successive reflections from both the illuminated surface and the opposing side, represented by arrows 416 and 418, and internal reflections from the illuminated surface 404, represented by arrow 420, resulting in a total internal reflection. If there is neither a reflective metal layer 422 nor textured region, the total transmittance, To, is as shown in Equation (I) as:

$$T_{tot} = (TT)(1+R^2+R^4+\ldots) = (TT)/(1-R^2) \quad (I)$$

This result has been obtained using the sum of a geometric series. If both surfaces are just polished silicon—air, then the total transmittance is 54% and the reflectance is 46%.

If the increase in the individual path lengths caused by the diffuse scattering is neglected and if the absorption coefficient is very low then the total effective path length is determined by just the number of reflections, and the total absorptance can be as shown in Equation (II):

$$A = \alpha d(1+R_2)(1+R_1R_2+R_2^2R_2^2+\ldots) = \alpha d(1+R_2)/(1-R_1R_2) \quad (II)$$

Here, α is the absorption coefficient in reciprocal cm, d is the thickness of the sample in cm, and the effective increase in path length is $Enh=(1+R_2)/(1-R_1R_2)$. The internal quantum efficiency (IQE) in the infrared where the absorption in silicon is low is thus $IQE=\alpha d(Enh)$. The external quantum efficiency (EQE) is $EQE=T_1 IQE$ and $EQE=T_1 \alpha d(Enh)$.

If both sides of an infrared photo detector are polished then $T_1=T_2=0.70$ and $R_1=R_2=0.3$, which gives Enh=1.4, IQE=1.4αd, and EQE=αd. If one side is polished and the other side has an oxide and a metal reflector, then $R_1=0.3$ and $R_2=1.0$, yielding an enhancement in infrared absorptance or Enh=3. $T_1$ is the transmittance of radiation incident on the first surface. $T_2$ is the transmittance of radiation striking the second surface from the semiconductor side. $R_1$ is the amount of radiation reflected back into the semiconductor for radiation striking the first surface from the semiconductor side. $R_2$ is the amount of radiation reflected back into the semiconductor for radiation striking the second surface from the semiconductor side.

In one aspect that can improve the infrared response, the illuminated side 404 is polished but the opposing side 410 is a textured dielectric material 408 with a reflecting region 422 (see FIG. 4). The texturing can be realized in a fashion to produce a true diffuse scattering (i.e. a Lambertian scattering) at the infrared wavelengths. This diffuse scattering layer/reflecting layer combination, in essence yields an $R_2$=100%, which is a diffuse reflector. The reflectance of the polished front side to the scattered light radiation is determined by solid angle considerations. Any incident light with an angle of incidence greater than the critical angle $\theta_c$, 424, will be totally internally reflected 420. If the backside scattering is totally diffused in a half sphere or Lambertian, the transmittance is then determined by the area of the surface ($\pi r^2$) within the critical angle $\theta_c$, 424, in this case 17° for silicon and air. The radius of the circle is r=d·sin (17°), where d is the thickness of the sample. This area is divided by the area of the half sphere ($2\pi d^2$). If the backside scattering is totally diffuse, the transmittance of the front planar surface is then roughly $T_1$=3% and the reflectance $R_1$=97%. The path length enhancement factor can be very large, as is shown in Equation (III):

$$Enh=(1+R_2)/(1-R_1R_2)=66 \quad (III)$$

This would result in an IQE=66αd and an EQE=46. If the backside includes a textured region and a truly diffusive scattering surface, and a mirror-like surface is used behind the back side, a very large enhancement of absorptance in the near infrared can be achieved. If the absorption in the semiconductor substrate is not assumed to be small but rather is taken into account, it can be shown that the enhancement factor for the IQE due to multiple reflections is modified from Equation (I) and as is shown in Equation (IV):

$$Enh=(1-\exp(-\alpha d))(1+R_2\exp(-\alpha d))/(1-R_1R_2\exp(-2\alpha d)) \quad (IV)$$

Figure 5:
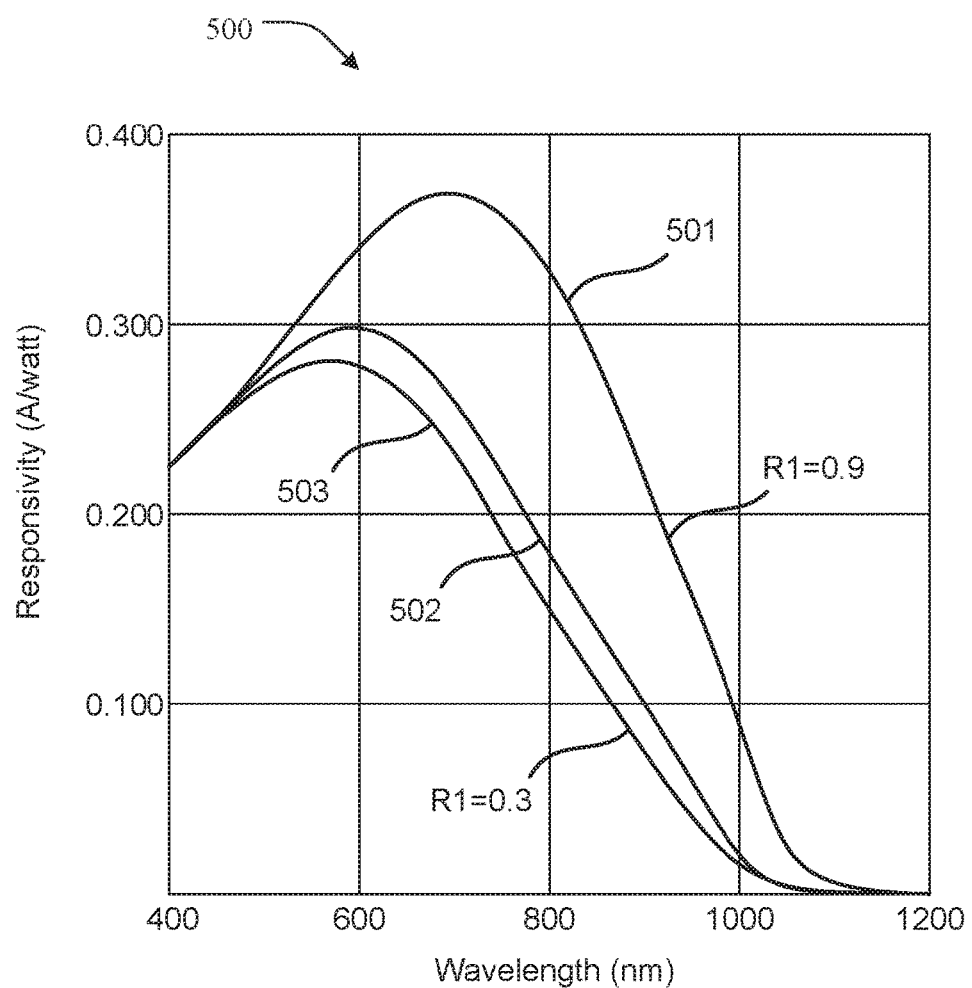
FIG. 5 is a graph showing calculated absorptance of infrared radiation in a thin silicon photodetector with light trapping and different amounts of light reflected back from the illuminated surface.

This allows a calculation of the responsivity in terms of the electrical current in Amperes per incident light power in Watts of photo detectors of different thickness d for different wavelengths λ, since the absorption coefficient α(λ) is a function of wavelength (see FIG. 5). If it is assumed that the textured side is an ideal reflector (i.e. $R_2$=1.0) and the amount of diffusive scattering of the textured surface varies from that of a planar surface, then the fraction of light reflected back from the opposing illuminated surface may vary. If the textured surface is planar, then there is only specular reflection, and $R_1$=0.3 and the enhancement in responsivity, as indicated by curve 600, is not large. If the textured surface is an ideal Lambertian diffusive surface then the fraction of light reflected back from the front surface may be very large, $R_1$=0.97. Several values of $R_1$ as illustrated by curves, 601, 602, and 603 are discussed herein and illustrated in FIG. 5, for a diffuse reflector, and these represent the fraction of light internally reflected back at the front surface. For purposes of the present disclosure, values of $R_1 \geq 0.9$ (curve 601) are deemed useful. The enhancement in absorptance described by Equation (IV) then varies with the fraction of light radiation reflected back from the illuminated surface and thickness of the sample, as is illustrated in FIG. 5. It should be noted that, while the techniques described herein have been used to enhance the absorptance at infrared and red light radiation, they are also applicable to visible light as the thickness of the silicon layer becomes thinner. Scattering and multiple internal reflections can also be used to increase the absorptance at yellow, green and even blue light that will not be totally absorbed in single passes within thin silicon layers. These techniques can be applied then to visible imagers with thin silicon absorption layers.

Figure 6:
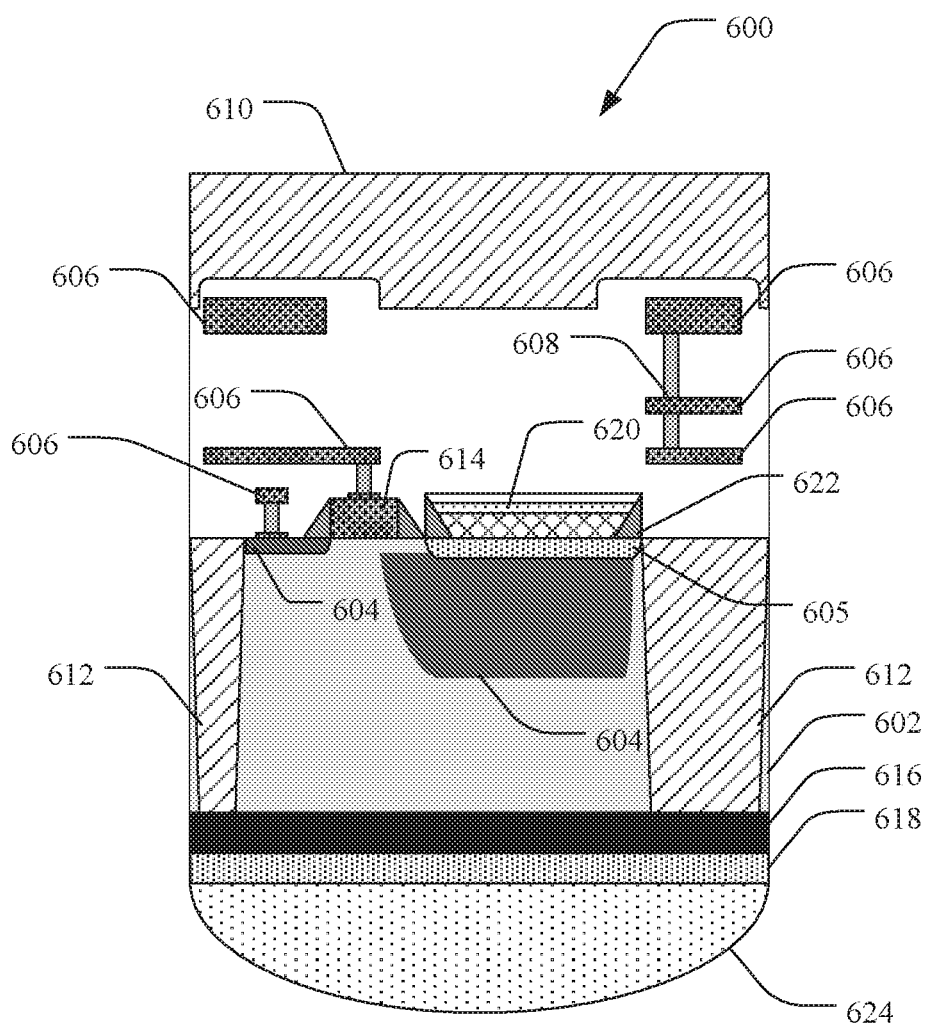
FIG. 6 is a schematic view of a photosensitive device in accordance with another aspect of the present disclosure.

In another aspect, FIG. 6 shows a cross-section of a BSI photosensitive pixel device 600. The photosensitive pixel device can include a semiconductor substrate 602 that can be referred to as bulk semiconductor material. The semiconductor substrate 602 includes at least one doped region 604, 605, that can be doped with a charge donating species, such as an electron donating or hole donating species, to cause the region to become more n-type or p-type as compared to the semiconductor substrate. In one aspect, for example, the doped region can be p-doped. In another aspect the doped region can be n-doped. The device can further include various metal regions 606, at least one via 608, a dielectric region 610, isolation element(s) 612, such as trench isolation elements, and an electrical transfer element 614.

Trench isolation elements can maintain pixel to pixel uniformity by reducing optical and electrical crosstalk. The isolation elements can be shallow or deep trench isolation. The trench isolation elements of FIG. 6 are shown as deep trench isolation elements. The isolation elements can include various materials, including, without limitation, dielectric materials, reflective materials, conductive materials, light diffusing features, and the like. These isolation regions can be configured to reflect incident light until it is absorbed, thereby increase the effective absorption length of the device.

A lens 624 and an anti-reflective coating 616 can be disposed on the backside of the pixel following thinning and trench isolation. A color filter 618 can be optically coupled to the lens to allow specific wavelength filtering of the electromagnetic radiation. A textured region 620 can be coupled to the semiconductor substrate 602 opposite the lens 624 in order to provide diffusive scattering and reflection of the incident electromagnetic radiation that passes through to the front side of the pixel. Thus the electromagnetic radiation can be focused within the semiconductor substrate 602 to the combined action of the textured region 620 and the isolation features 612. Additionally, side wall insulators 622 can be formed about the transfer element 606 and also around textured region 620 to facilitate proper spacing.

In general, isolation features can maintain pixel to pixel uniformity when multiple pixels are used in association by reducing optical and electrical crosstalk there between. The isolation feature can be shallow or deep, depending on the desired design. The isolation features can be generated using various materials including, without limitation, dielectric materials, reflective materials, conductive materials, light diffusing features, and the like. Additionally, in some aspects the isolation feature can be a void in the semiconductor substrate. In one aspect, isolation features can also be configured to reflect incident electromagnetic radiation until it is absorbed, thereby increasing the effective absorption length of the incident light and reducing optical crosstalk into neighboring devices. Furthermore, the devices according to aspects of the present disclosure can also independently include one or more vias, dielectric regions, and the like.

Figure 7:
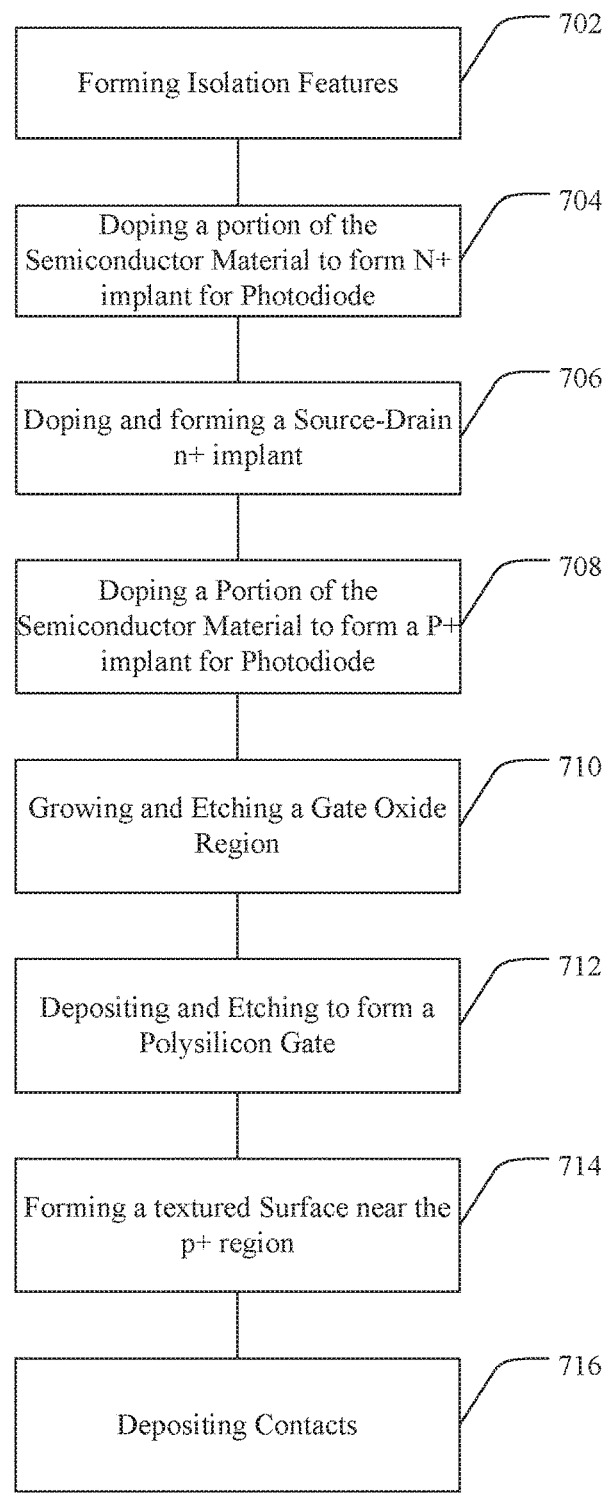
FIG. 7 is a depiction of a method of making a photosensitive imager device in accordance with another aspect of the present disclosure.

In other aspects of the present disclosure, various methods of making a photosensitive device as described herein are contemplated. In one aspect, as is shown in FIG. 7, a method of making a backside-illuminated photosensitive imager device can include traditional fabrication steps along with additional steps of forming isolation features 702, doping a portion of the semiconductor material to form n+ implant 704, doping a portion with an n+ implant to form a source-drain 706, doping a portion of the semiconductor substrate with a p+ dopant to form p+ implant 708, and growing and etching a gate oxide region 710. The method can also include depositing and etching to form a polysilicon gate 712, forming a textured surface near the p+ implant region 714, and depositing the contacts 716. It should be noted that the present scope is not limited to the above described doping scheme. Thus, this process can be applied in modular form to the steps involved in the fabrication of a conventional BSI CMOS imager pixel arrays. In other words, this modular processing method can be an insert of a process module in the process flow of the fabrication of a conventional BSI imager. In one aspect, the conventional process can be stopped just before the first via etch but after the deposition of the interlayer dielectric. At this point, rather than etch a via, the mask that was used to define the p-type implantation on top of the n-type diode can be used to mask and open the area over the p-type layer. A sidewall spacer process can be employed on the inside border of this opening to insure adequate spacing of the textured layers to be deposited away from the transfer device. A dielectric region, a textured region, and in some cases a metal or oxide reflector can be deposited in the area over the p-type region. As such, this module can be introduced into a conventional process flow with minimal changes. Subsequently, an interlayer dielectric similar to the first interlayer dielectric can be deposited over the metal reflector, and the combined interlayer dielectrics can be chemically and mechanically polished to planarize the surface. The normal contact mask can then be used to open vias resulting in minimal changes to the conventional process flow. A via can be opened to the metal reflector layer to control the potential of this layer and if appropriate, the textured layer to avoid charging during processing or for the region, can act as an MOS gate.

CMOS imagers are commonly used as visible light cell phone, still frame and video cameras, with BSI devices becoming a common structure. Cameras for use as infrared imagers for security and surveillance are, however, not commonly available. The present methods allow the conversion of visible light imagers to include the capability for imaging in the near infrared. Thus, the texture processing methods described can be adapted to a traditional fabrication process for visible imagers to provide an additional capability for near infrared imaging. The CMOS imagers can employ any pixel design including more than one transistor or transfer device. In some aspects, the transfer device can be a p-channel transfer gate or an n-channel transfer gate and associated implant polarities.

Conventional CCD imagers employ photodiode detectors similar to those used in CMOS imagers, and as such, the present methods can also be applied to the fabrication of CCD imagers to form devices capable of detecting infrared wavelengths in appreciable amounts and with appreciable enhancement.

The photodetecting diode used in the imager pixel can also include MOS diodes rather than doped junction diodes. MOS diodes use a pulsed bias to form a depletion region and light collecting region near the surface rather than a junction diode. The method described herein can equally be applied and inserted into imager pixels with MOS diodes or CCD imagers where the light generated carriers are collected in a surface depletion region. In these latter cases the metal reflecting gate can be driven with a voltage to act as a MOS or CCD gate.

Figure 8A:
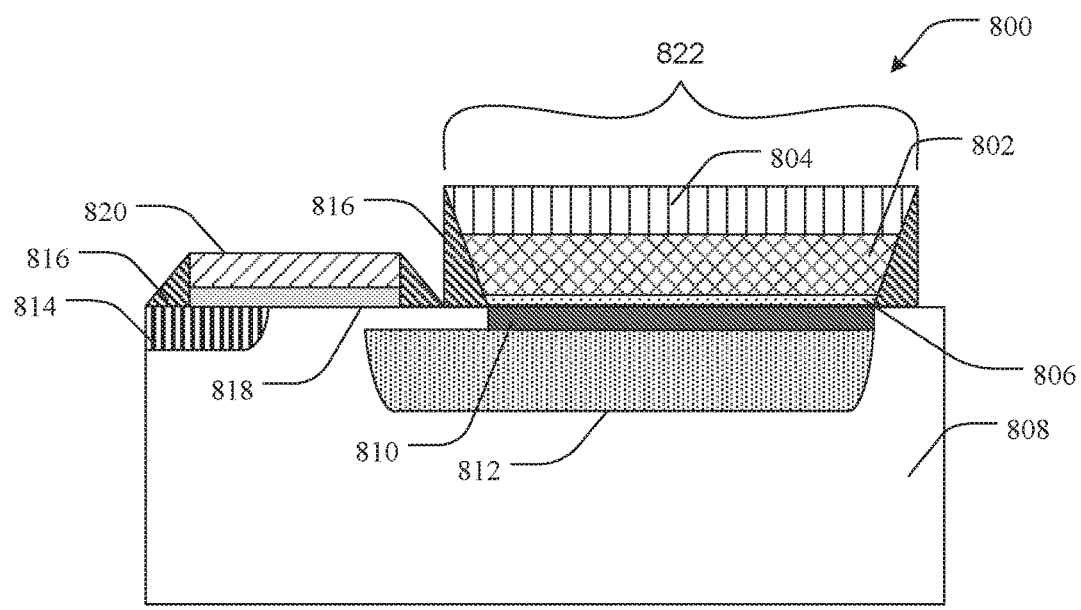
FIG. 8a is a schematic view of a photosensitive device in accordance with yet another aspect of the present disclosure.
Figure 8B:
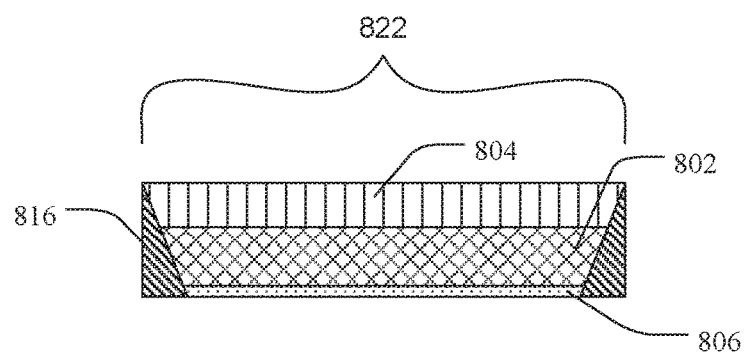
FIG. 8b is a schematic view of a photosensitive device in accordance with yet another aspect of the present disclosure.

In one aspect, as is shown in FIG. 8a, a BSI photosensitive imager device 800, can include a textured region 802, a reflecting layer 804, and a dielectric layer 806 disposed between the semiconductor substrate 808 and the textured region 802. The device can further include doped regions 810, 812, a drain region 814, sidewall spacers 816, and a transfer device having a gate insulator 818 and a polysilicon gate 820, as has been described. The reflecting/diffusing region 822, shown separately in FIG. 8b, is thus effectively a process module that can be inserted into a standard CMOS imager manufacturing process as has been described. In one aspect, this process module of forming the reflective/diffusing region can be inserted after deposition of the first dielectric spacer layer and before a contact etch step in a CMOS image sensor manufacturing process. A mask can be used to create the implantation of the P+ surface region on the photodiode, which can also be used to etch an aperture in the newly formed dielectric layer. The spacers 816 can be formed on the inside of this hole using conventional techniques to space the textured region 802 away from the edge of the P+ region. The hole can then be filled with any one of a variety of "process modules" to form the textured region 802. After completion of the textured region, the conventional process can be continued starting with the contact etch mask. It should be noted that the present scope also includes aspects having a lens without an anti-reflecting coating, and aspects having an anti-reflecting coating associated with the semiconductor substrate without a lens. Additionally, a color filter (not shown) can be optically coupled to the lens to allow specific wavelength filtering of the electromagnetic radiation. Incident electromagnetic radiation passing through the color filter prior to contacting the semiconductor substrate can be filtered according to the characteristics of the filter.

One simple aspect to enhance the infrared response of photo detecting pixels can include a module consisting essentially of a dielectric region, an oxide, and a metal reflector region without texture. Even this simple structure can provide, by virtue of Equation III with $R_2=1.0$, $R_1=0.3$, an enhancement in the infrared response over that of a single pass of radiation by a factor of about 2.

The textured region, including surface features as well as surface morphologies, can be formed by various techniques, including plasma etching, reactive ion etching, porous silicon etching, lasing, chemical etching (e.g. anisotropic etching, isotropic etching), nanoimprinting, material deposition, selective epitaxial growth, and the like. In one aspect, the texturing process can be performed during the manufacture of the photosensitive device. In another aspect, the texturing process can be performed on a photosensitive device that has previously been made. For example, a CMOS, CCD, or other photosensitive element can be textured following manufacture. In this case, material layers may be removed from the photosensitive element to expose the semiconductor substrate or the dielectric region upon which a textured region can be formed.

Additionally, it is contemplated that the textured region can be formed having surface features with a size and position distribution that allows tuning to a desired light wavelength or range of wavelengths. As such, a given textured region can contain an arrangement of surface features that facilitate tuning of the textured region to a preselected wavelength of light. Any wavelength that can be selectively tuned via surface features in the textured region is considered to be within the present scope. In one aspect, for example, the preselected wavelength or wavelengths of light can be in the near infrared or infrared range. In another aspect, the preselected wavelength of light can be greater than or equal to about 800 nm.

In one aspect, tuning can be accomplished by generating a texture with sufficient long-range lateral order such that interference directs the photons within a certain wavelength range in such a direction that they will experience total internal reflection (TIR) on the surface opposite the texture. This will enhance absorptance and QE. In another aspect, the texture will be additionally tuned to minimize photons reflected into the range of angles where TIR will not occur. This further enhances absorptance and QE. In another aspect, the texture will be additionally tuned to keep the angle at which the photons at the preselected wavelength impinge on the surface opposite the texture as close to normal as possible while still maintaining TIR. This maximized the propagation path, thereby further increasing absorptance and QE, and simultaneously minimizing the optical crosstalk at that preselected wavelength.

For texture with poor long-range lateral order, the texture can be tuned for wavelength selection. In one aspect, the average lateral modulation spatial frequency will be large enough compared to the diffraction limited spot size at the preselected wavelength that effective index descriptions are inaccurate and scattering is substantial. In another aspect, the average modulation amplitude will not be much smaller than the preselected wavelength, so that the surface will not substantially behave as though it were planar.

Regardless of the degree of long-range lateral order, the individual features that make up the texture can be adjusted in shape so as to maximize the number of photons that are incident on the opposite surface at an angle beyond the critical angle, $\theta_c$. In another aspect, these individual features are adjusted to minimize the number of photons that are incident on the opposite surface at an angle less than the critical angle, $\theta_c$.

The texture can also be tuned to provide polarization selectivity. In one aspect, the rotational symmetry in the plane of the texture can be maximized, thereby leading to uniform behavior over the maximum polarization states. In another aspect, the rotational symmetry in the plane of the texture can be minimized, thereby leading to maximal difference in the behavior for differing polarization states.

One effective method of producing a textured region is through laser processing. Such laser processing allows discrete locations of the dielectric region or other substrate to be textured. A variety of techniques of laser processing to form a textured region are contemplated, and any technique capable of forming such a region should be considered to be within the present scope. Laser treatment or processing can allow, among other things, enhanced absorptance properties and thus increased electromagnetic radiation focusing and detection. The laser treated region can be associated with the surface nearest the impinging electromagnetic radiation or, in the case of BSI devices, the laser treated surface can be associated with a surface opposite in relation to impinging electromagnetic radiation, thereby allowing the radiation to pass through the semiconductor substrate before it hits the laser treated region.

In one aspect, for example, a target region of the semiconductor material can be irradiated with laser radiation to form a textured region. Examples of such processing have been described in further detail in U.S. Pat. Nos. 7,057,256, 7,354,792 and 7,442,629, which are incorporated herein by reference in their entireties. Briefly, a surface of a substrate material is irradiated with laser radiation to form a textured or surface modified region. Such laser processing can occur with or without a dopant material. In those aspects whereby a dopant is used, the laser can be directed through a dopant carrier and onto the substrate surface. In this way, dopant from the dopant carrier is introduced into the target region of the substrate material. Such a region incorporated into a substrate material can have various benefits in accordance with aspects of the present disclosure. For example, the target region typically has a textured surface that increases the surface area of the laser treated region and increases the probability of radiation absorption via the mechanisms described herein. In one aspect, such a target region is a substantially textured surface including micron-sized and/or nano-sized surface features that have been generated by the laser texturing. In another aspect, irradiating the surface of the substrate material includes exposing the laser radiation to a dopant such that irradiation incorporates the dopant into the substrate. Various dopant materials are known in the art, and are discussed in more detail herein.

Thus the surface of the substrate or dielectric region is chemically and/or structurally altered by the laser treatment, which may, in some aspects, result in the formation of surface features appearing as microstructures or patterned areas on the surface and, if a dopant is used, the incorporation of such dopants into the substrate material. In some aspects, the features or microstructures can be on the order of 50 nm to 20 µm in size (i.e. size at the base, or in some cases center-to-center) and can assist in the absorption of electromagnetic radiation. In other words, the textured surface can increase the probability of incident radiation being absorbed.

The type of laser radiation used to surface modify a material can vary depending on the material and the intended modification. Any laser radiation known in the art can be used with the devices and methods of the present disclosure. There are a number of laser characteristics, however, that can affect the surface modification process and/or the resulting product including, but not limited to the wavelength of the laser radiation, pulse duration, pulse fluence, pulsing frequency, polarization, laser propagation direction relative to the semiconductor material, etc. In one aspect, a laser can be configured to provide pulsatile lasing of a material. A short-pulsed laser is one capable of producing femtosecond, picosecond and/or nanosecond pulse durations. Laser pulses can have a central wavelength in a range of about from about 10 nm to about 8 µm, and more specifically from about 200 nm to about 1200 nm. The pulse duration of the laser radiation can be in a range of from about tens of femtoseconds to about hundreds of nanoseconds. In one aspect, laser pulse durations can be in the range of from about 50 femtoseconds to about 50 picoseconds. In another aspect, laser pulse durations can be in the range of from about 50 picoseconds to 100 nanoseconds. In another aspect, laser pulse durations are in the range of from about 50 to 500 femtoseconds.

The number of laser pulses irradiating a target region can be in a range of from about 1 to about 2000. In one aspect, the number of laser pulses irradiating a target region can be from about 2 to about 1000. Further, the repetition rate or pulsing frequency can be selected to be in a range of from about 10 Hz to about 10 µHz, or in a range of from about 1 kHz to about 1 MHz, or in a range from about 10 Hz to about 1 kHz. Moreover, the fluence of each laser pulse can be in a range of from about 1 kJ/m$^2$ to about 20 kJ/m$^2$, or in a range of from about 3 kJ/m$^2$ to about 8 kJ/m$^2$.

As has been described, the devices according to aspects of the present disclosure can additionally include one or more reflecting regions. The reflecting region can be deposited over the entire textured region or only over a portion of the textured region. In some aspects, the reflecting region can be deposited over a larger area of the device than the textured region. The reflecting region can be positioned to reflect electromagnetic radiation passing through the texture region back through the textured region. In other words, as electromagnetic radiation passes into the semiconductor substrate, a portion that is not absorbed contacts the textured region. Of that portion that contacts the textured region, a smaller portion may pass though the textured region to strike the reflecting region and be reflected back through the textured region toward the semiconductor substrate.

A variety of reflective materials can be utilized in constructing the reflecting region, and any such material capable of incorporation into a photosensitive device is considered to be within the present scope. Non-limiting examples of such materials include a Bragg reflector, a metal reflector, a metal reflector over a dielectric material, a transparent conductive oxide such as zinc oxide, indium oxide, or tin oxide, and the like, including combinations thereof. Non-limiting examples of metal reflector materials can include silver, aluminum, gold, platinum, reflective metal nitrides, reflective metal oxides, and the like, including combinations thereof. In one aspect, a BSI photosensitive imager device can include a dielectric layer positioned between the reflecting region and the textured region. In one specific aspect, the dielectric layer can include an oxide layer and the reflecting region can include a metal layer. The surface of the metal layer on an oxide acts as a mirror-like reflector for the incident electromagnetic radiation from the backside. It should be noted that the reflective region is not biased with a voltage.

In another aspect, the textured region can include a hemispherical grained polysilicon or coarse grained polysilicon material and the reflective region can include a metal layer. The hemispherical grained or coarse grained silicon can act as a diffusive scattering site for the incident optical radiation and the dielectric layer and the reflective region together can act as a reflector.

In still another aspect, the photosensitive imager can include selective epitaxial silicon growth for generating the textured region on top of the junction formed by the doped regions (e.g. a photodiode) without the dielectric region being present (not shown). An oxide and metal reflector, for example, can be coupled to the textured region. The epitaxial growth places the textured region away from the top of the junction, and the rapid etch characteristics of grain boundaries can be used to create texturing.

Additionally, the textured surface of a metal on a roughened oxide can act as a diffusive scattering site for the incident electromagnetic radiation and also as a mirror-like reflector. Other aspects can utilize porous materials for the texturing. Porous polysilicon, for example, can be oxidized or oxide deposited and a reflective region such as a metal reflector can be associated therewith to provide a scattering and reflecting surface. In another aspect, aluminum can be subjected to anodic oxidation to provide porous aluminum oxide, a high dielectric constant insulator. This insulator can be coated with aluminum or other metals to provide a scattering and reflecting surface.

In one specific aspect, a reflective region can include a transparent conductive oxide, an oxide, and a metal layer. The transparent oxide can be textured and a metal reflector deposited thereupon. The textured surface of the metal on a roughened transparent conductive oxide can act as a diffusive scattering site for the incident electromagnetic radiation.

In another specific aspect, a Bragg reflector can be utilized as a reflective region. A Bragg reflector is a structure formed from multiple layers of alternating materials with varying refractive indexes, or by some other method of inducing a periodic variation in the propagation constant. Each layer boundary causes a partial reflection of an optical wave. For waves whose wavelength is close to four times the optical thickness of the layers, the many reflections combine with constructive interference, and the layers act as a high-quality reflector. Thus the coherent super-positioning of reflected and transmitted light from multiple interfaces in the structure interfere so as to provide the desired reflective, transmissive, and absorptive behavior. In one aspect, the Bragg reflector layers can be alternating layers of silicon dioxide and silicon. Because of the high refractive index difference between silicon and silicon dioxide, and the thickness of these layers, this structure can be fairly low loss even in regions where bulk silicon absorbs appreciably. Additionally, because of the large refractive index difference, the optical thickness of the entire layer set can be thinner, resulting in a broader-band behavior and fewer fabrications steps.

In another aspect, texturing can be applied to the light-incident surface of the semiconductor substrate in order to facilitate additional scattering as light enters the device. In some aspects it can be useful to also include trench isolation to preclude optical crosstalk between pixels due to this forward scattering. By also texturing the trench isolation, light can be reflected back into the semiconductor from the edges of the pixel. It is noted that, for a BSI architecture, the light-incident surface is on the back side of the semiconductor substrate opposite the photodiode.

Figure 9A:
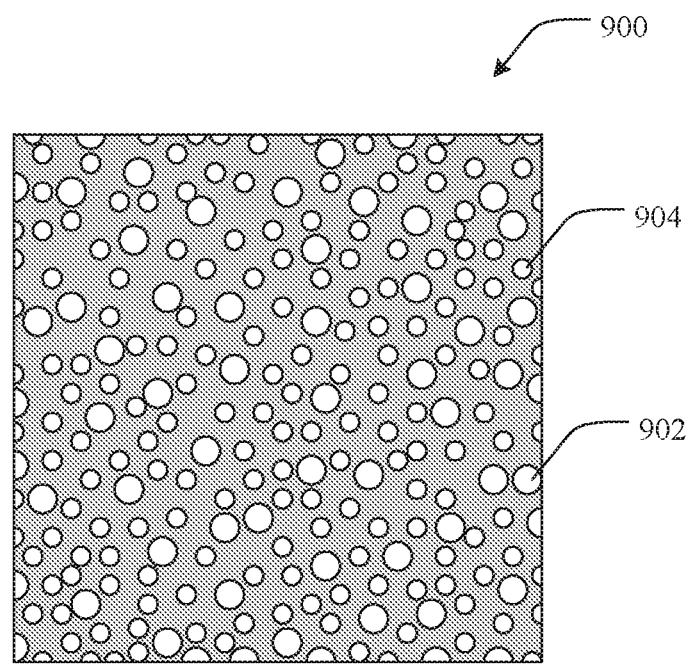
FIG. 9a is a top view of a textured region in accordance with one aspect of the present disclosure.
Figure 9B:
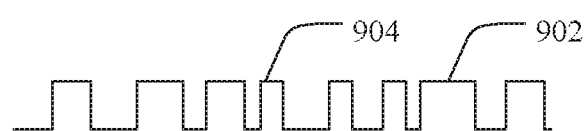
FIG. 9b is a cross-sectional view of a textured surface in accordance with an aspect of the present disclosure.

In another embodiment of the present disclosure, a backside texture surface an imager pixel is shown in FIGS. 9a,b. Specifically, FIG. 9a shows a top view and FIG. 9b shows a cross sectional view of a textured region 900 including pillars etched into a semiconductor material. In one aspect, the textured region can include a plurality of pillars having a uniform size. In another aspect, the textured region can include a plurality of pillars in a regular (ordered pattern) array. In yet another aspect, the textured region can include a plurality of pillars of variable sizes (902, 904 in FIG. 9). In a further aspect, the textured region can be arranged in a non-uniform array (see FIG. 9). Similarly, holes of uniform or variable sizes can be etched into the silicon and covered by a thin layer of oxide and metal to achieve similar effects as the pillars. Moreover, the pillar or hole features can be etched into a thin layer of oxide and metal, or they can be etched into a thicker oxide on the semiconductor substrate and covered by a reflective material, such as silver or aluminum. In the former case the minimum oxide thickness between the semiconductor substrate and metal can be in the range of about 5 nm to 100 nm. In another aspect, the thickness can be about 40 nm.

The height of the pillars, shown in the cross sectional view of FIG. 9b, can vary depending on the design and desired use of the device. In one aspect, however, the average pillar height can be a multiple of a quarter wavelength of the desired light wavelength selectivity in the medium to which they are etched (e.g., the semiconductor material or the dielectric material. In another aspect, the average center-to-center distance between pillars can be about one half the wavelength of light desired to be absorbed (½ λ), multiples of one half the wavelength, or larger than half the wavelength of desired light selectivity. The pillars can also be designed to be anti-reflecting to the specular reflection of light or the zero$^{th}$ order diffraction from the texture. The higher order diffractions of light from the texture can be designed to optimize the reflection of light at any particular oblique angle. In this manner most of the incident light can be reflected at angles to maximize light trapping in the imager pixel. Light scattered by the front side textured region and striking the semiconductor side of the back interface can be totally internally reflected if it is outside of the critical angle as defined by Snell's law.

Figure 10A:
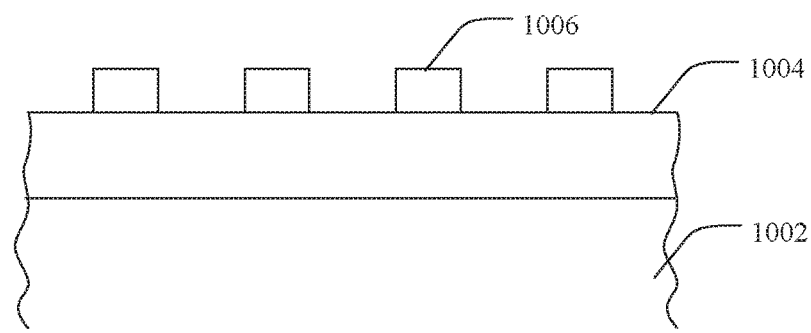
FIG. 10a is a cross-sectional view of a photosensitive device during manufacture in accordance with another aspect of the present disclosure.
Figure 10B:
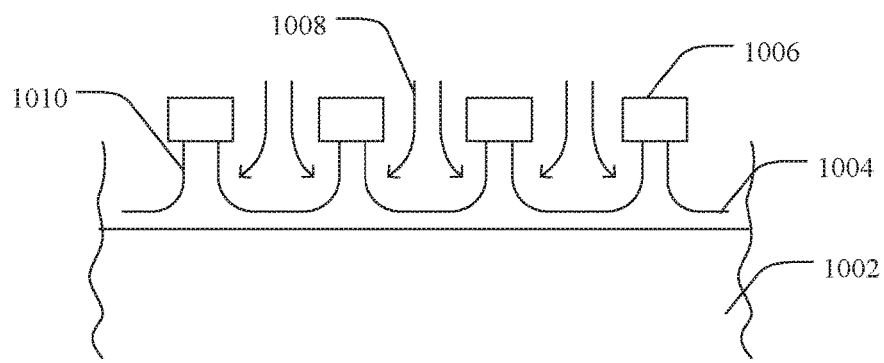
FIG. 10b is a cross-sectional view of a photosensitive device during manufacture in accordance with another aspect of the present disclosure.
Figure 10C:
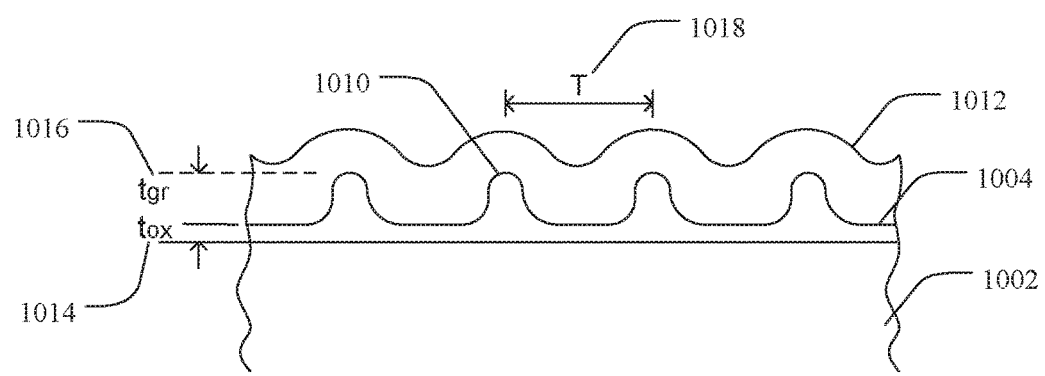
FIG. 10c is a cross-sectional view of a photosensitive device during manufacture in accordance with another aspect of the present disclosure.

One exemplary method of creating a textured region such as a diffraction grating is shown in FIGS. 10a-c. In this case, a semiconductor substrate 1002 having an oxide layer 1004 is provided. A mask 1006 as a 2-dimensional grating is formed on the oxide layer 1004, as is shown in FIG. 10a. The oxide layer 1004 can then be etched with an isotropic etch 1008 to form a plurality of pillars 1010, as shown in FIG. 10b. In one aspect, undercutting of the pillars by the isotropic etch 1008 can results in pillars 1010 that are narrow at the top of the pillar than the bottom. The mask 1006 can be removed and a rinse etch used to round off sharp corners and tops of the pillars 1010, as is shown in FIG. 10c. A reflecting material 1012 (e.g. a metal) can be deposited as a reflector. The rounded surfaces can reduce the amplitude of the specular reflection or zero$^{th}$ order diffraction of light from the diffraction grating (i.e., the textured region). Thus, the light will be scattered more effectively at oblique angles. FIG. 10c also shows the thickness ($t_{ox}$) 1014 of oxide layer 1004, the grating thickness ($t_{gr}$) 1016, and the distance from pillar peak-to-peak (T) 1018. While the dimensions of the grating can vary depending on the design of the device and the desired usage, in one aspect the average thickness of $t_{ox}$ can have a range of from about 10 nm to about 100 nm. In another aspect, the to, can have a thickness of less than about 50 nm. The average grating thickness $t_{gr}$, measured from the base of the oxide layer 1004 to a pillar peak 1010, can be about a quarter of the wavelength of the desired light wavelength selectivity in the oxide layer (~¼λ). For example, light having a wavelength of about 1000 nm can dictate $t_{gr}$ having a thickness of greater than about 175 nm. The average distance (T) from pillar peak-to-peak can be greater than 300 nm for light having a wavelength of greater than 1000 nm.

Another exemplary method of creating a textured region such as a diffraction grating is shown in FIGS. 11a-d, which are cross-sectional views of a photosensitive device at different stages of manufacturing. In one specific aspect, the semiconductor material can be amorphous silicon, which can have a texture surface with a high index of refraction because amorphous silicon can be deposited at low temperatures.

Figure 11A:
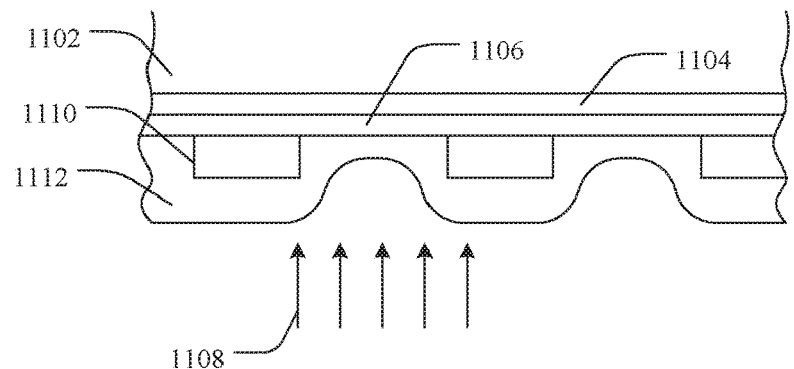
FIG. 11a is a cross-sectional view of a photosensitive device during manufacture in accordance with yet another aspect of the present disclosure.
Figure 11B:
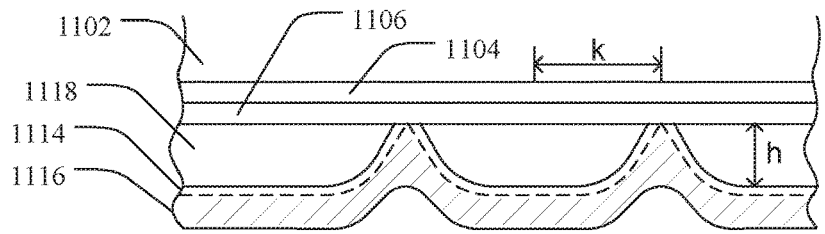
FIG. 11b is a cross-sectional view of a photosensitive device during manufacture in accordance with yet another aspect of the present disclosure.
Figure 11C:
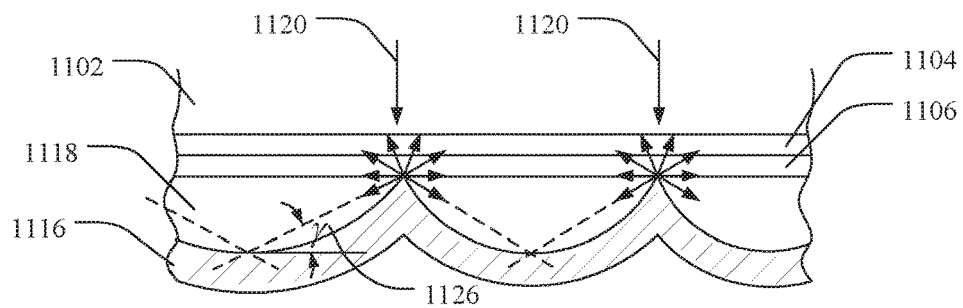
FIG. 11c is a cross-sectional view of a photosensitive device during manufacture in accordance with yet another aspect of the present disclosure.
Figure 11D:
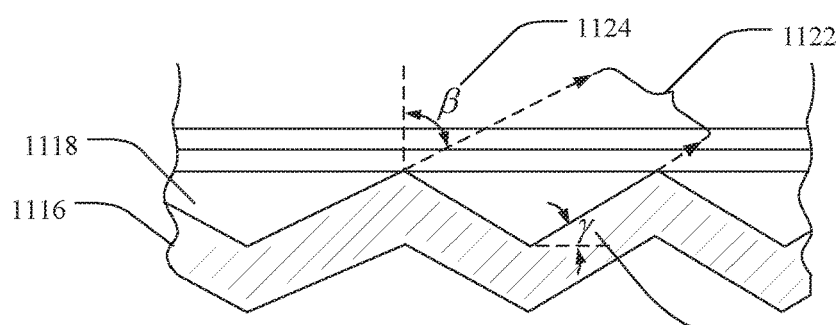
FIG. 11d is a cross-sectional view of a photosensitive device during manufacture in accordance with yet another aspect of the present disclosure.

Specifically, FIGS. 11a-d show a one dimensional grating, such as a plurality of grooves, or in two dimensions an array of pyramidal structures being formed on or in the photosensitive device. In FIG. 11a, a semiconductor material 1102 can be coupled to a thin layer of oxide 1104 and a layer of nitride 1106. In this aspect, the front side 1102 of the pixel in the P+ diode surface area has been opened in the first interlayer dielectric. The semiconductor material 1102 can be etched 1108 to form a mask 1110 using standard techniques on an opposite side where incident light enters the device. Furthermore, in some aspects another layer of a semiconductor material 1112 such as amorphous silicon can be deposited, and an anisotropic etch can be used in a "sidewall" like process. A reflecting region comprising a dielectric layer 1114 and metallic layer 1116 can be deposited on the etched surface. In one dimensional arrays this produces a series lines of material 1118 and grooves in the semiconductor material that functions as a diffraction grating 1120 (FIG. 11c). The distance from one groove to the neighboring groove (2 k, FIG. 11b) can be determined by the diffraction angle for different orders (m) of diffraction. The first order diffraction, 1122, can be selected to be a large angle βeta (β) 1124, thereby maximizing light trapping effects. The height of the original pillars are measured from the valley to the peak of the pillar identified as h, which determines the "blaze" angle gamma (γ) 1126 of the grating and the efficiency of the diffraction into different diffraction orders. In two dimensions, the semiconductor structure can have pillars rather than lines and the final structure is a two dimensional grating. Similar one dimensional grating design considerations can also be applied.

In yet another aspect, fully sub-wavelength pillars and grating structures can be used to form anti-reflecting structures for zero$^{th}$ order diffraction or to form plasmonic structures. The zero$^{th}$ order diffraction from such sub-wavelength structures can result in evanescent waves in the imager pixel. These evanescent waves will result in efficient absorption of the light striking the back in the imager pixel. Higher order diffractions in these structures will result in guided waves along the back surface but theses will be reflected by the isolation areas. In this manner efficient light trapping and absorption of infrared light can be achieved.

Figure 12:
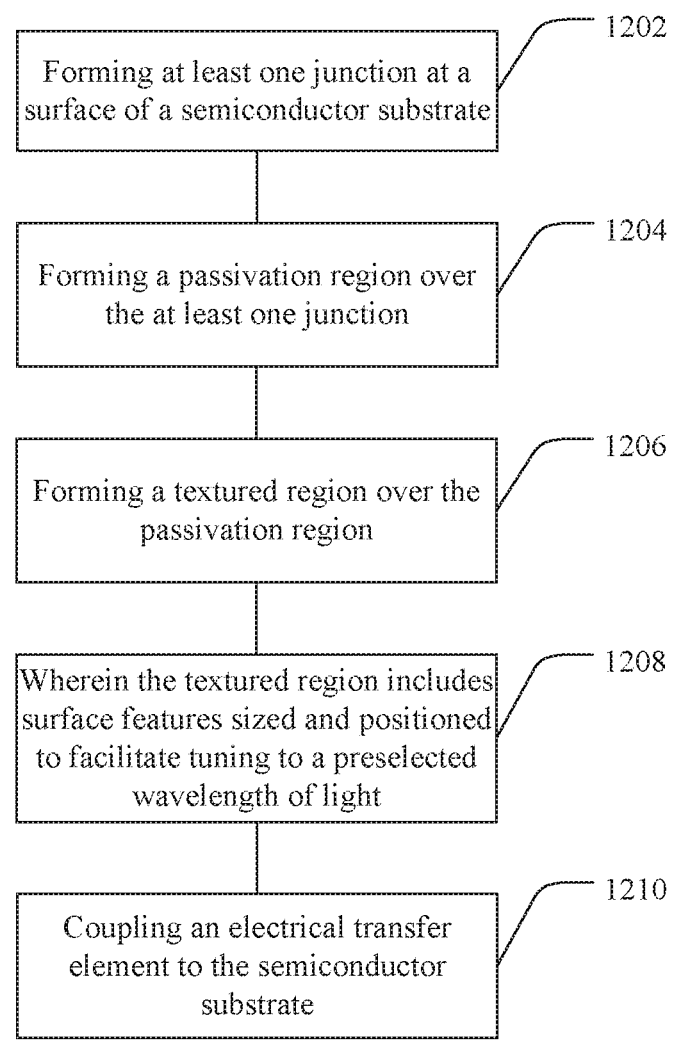
FIG. 12 is a depiction of a method of making a photosensitive imager device in accordance with another aspect of the present disclosure.

In other aspects of the present disclosure, various methods of making photosensitive diodes, pixels, and imagers, are contemplated. In one aspect, as is shown in FIG. 12, a method of making a BSI photosensitive imager device can include forming at least one junction at a surface of a semiconductor substrate 1202, forming a dielectric region over the at least one junction 1204, and forming a textured region over the dielectric region 1206, where the textured region includes surface features sized and positioned to facilitate tuning to a preselected wavelength of light 1208. The dielectric region thus isolates the at least one junction from the textured region, and the semiconductor substrate and the textured region are positioned such that incoming electromagnetic radiation passes through the semiconductor substrate before contacting the textured region. The method also includes coupling an electrical transfer element to the semiconductor substrate 118 such that the electrical transfer element is operable to transfer an electrical signal from the at least one junction. In one aspect, multiple pixels can be associated together to form an imager. A dielectric region can also be disposed on the backside of the photosensitive imager device to protect and/or reduce the dark current of the device. The method can also include coupling an electrical transfer element to the semiconductor substrate 1210 such that the electrical transfer element is operable to transfer an electrical signal from the at least one junction.

Of course, it is to be understood that the above-described arrangements are only illustrative of the application of the principles of the present disclosure. Numerous modifications and alternative arrangements may be devised by those skilled in the art without departing from the spirit and scope of the present disclosure and the appended claims are intended to cover such modifications and arrangements. Thus, while the present disclosure has been described above with particularity and detail in connection with what is presently deemed to be the most practical embodiments of the disclosure, it will be apparent to those of ordinary skill in the art that numerous modifications, including, but not limited to, variations in size, materials, shape, form, function and manner of operation, assembly and use may be made without departing from the principles and concepts set forth herein.

What is claimed is:

1. A method of making a backside-illuminated photosensitive imager device, comprising:
   forming at least one junction at a surface of a semiconductor substrate;
   forming a dielectric region over the at least one junction;
   forming a textured region over the dielectric region, wherein the textured region includes surface features sized and positioned to facilitate tuning to a preselected wavelength of light, wherein the dielectric region isolates the at least one junction from the textured region, and wherein the semiconductor substrate and the textured region are positioned such that incoming electromagnetic radiation passes through the semiconductor substrate before contacting the textured region; and
   coupling an electrical transfer element to the semiconductor substrate such that the electrical transfer element is operable to transfer an electrical signal from the at least one junction.

2. The method of claim 1, wherein forming the textured region is by a process selected from the group consisting of plasma etching, reactive ion etching, porous silicon etching, lasing, chemical etching, nanoimprinting, material deposition, selective epitaxial growth, lithography, and combinations thereof.

3. The method of claim 1, wherein forming the textured region further includes:
   depositing a mask on the dielectric region;
   etching the dielectric region through the mask to form surface features; and
   removing the mask from the dielectric region.

4. The method of claim 3, further comprising etching the surface features to round exposed edges.

5. The method of claim 1, further comprising coupling a lens to the semiconductor substrate at a surface opposite the at least one junction, wherein the lens is positioned to focus incident electromagnetic radiation into the semiconductor substrate.

6. The method of claim 1, wherein forming the textured region further includes:
   depositing a first semiconductor material on the dielectric region;
   texturing the first semiconductor material to form a mask;
   depositing a second semiconductor material on the mask; and
   etching the second semiconductor material to form the textured region.

7. The method of claim 6, wherein texturing the second semiconductor material further includes:
   etching the second semiconductor material to form a plurality of scallops pointing toward the semiconductor substrate.

8. The method of claim 7, wherein the first and second semiconductor materials includes a member selected from the group consisting of silicon, polysilicon, amorphous silicon, and combinations thereof.

9. The method of claim 1, further comprising depositing an anti-reflective layer on the semiconductor substrate at a surface opposite the at least one junction, such that incident light passes through the anti-reflective layer prior to contacting the semiconductor substrate.

10. The method of claim 9, further comprising forming at least one isolation feature in the semiconductor substrate, the at least one isolation feature being positioned to reflect light impinging thereon back into the semiconductor substrate.

* * * * *